(12) United States Patent
Noack et al.

(10) Patent No.: US 11,594,271 B2
(45) Date of Patent: Feb. 28, 2023

(54) MEMORY CELL DRIVER, MEMORY CELL ARRANGEMENT, AND METHODS THEREOF

(71) Applicant: Ferroelectric Memory GmbH, Dresden (DE)

(72) Inventors: Marko Noack, Dresden (DE); Rolf Jähne, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 23 days.

(21) Appl. No.: 16/861,640

(22) Filed: Apr. 29, 2020

(65) Prior Publication Data
US 2020/0357455 A1    Nov. 12, 2020

(30) Foreign Application Priority Data

May 8, 2019    (DE) .................... 10 2019 111 967.7

(51) Int. Cl.
*G11C 11/22*    (2006.01)
*G11C 5/06*    (2006.01)

(52) U.S. Cl.
CPC ............ *G11C 11/2259* (2013.01); *G11C 5/06* (2013.01); *G11C 11/2253* (2013.01); *G11C 11/2273* (2013.01); *G11C 11/2275* (2013.01); *G11C 11/2297* (2013.01)

(58) Field of Classification Search
CPC ... G11C 11/2259; G11C 11/2297; G11C 5/06; G11C 11/2273; G11C 11/2275; G11C 11/2253; G11C 8/08; G11C 11/1653; G11C 11/1697
See application file for complete search history.

(56) References Cited

U.S. PATENT DOCUMENTS

| 2003/0086285 | A1* | 5/2003 | Yamaguchi | ............. G11C 11/22 365/145 |
| 2004/0184338 | A1 | 9/2004 | Choi | |
| 2004/0213033 | A1* | 10/2004 | Maruyama | ............. G11C 11/22 365/145 |

(Continued)

FOREIGN PATENT DOCUMENTS

| DE | 10318607 A1 | 12/2003 |
| EP | 1 308 959 B1 | 7/2008 |

*Primary Examiner* — Jay W. Radke
(74) *Attorney, Agent, or Firm* — Hickman Becker Bingham Ledesma LLP; Malgorzata A. Kulczycka

(57) ABSTRACT

In various embodiments, a memory cell arrangement is provided including a memory cell driver and one or more memory cells, wherein one or more control nodes of each of the one or more memory cells are electrically conductively connected to one or more output nodes of the memory cell driver. The memory cell driver may include: a first supply node to receive a first supply voltage and a second supply node to receive a second supply voltage, a plurality of input nodes to receive a plurality of input voltages, one or more output nodes, and a logic circuit connected to the first supply node, the second supply node, the plurality of input nodes, and the one or more output nodes, wherein the logic circuit includes one or more logic gates and is configured to connect via the one or more logic gates either the first supply node or the second supply node to the one or more output nodes in response to the plurality of input voltages.

20 Claims, 12 Drawing Sheets

(56) References Cited

U.S. PATENT DOCUMENTS

| | | | |
|---|---|---|---|
| 2004/0257864 A1* | 12/2004 | Tamai | G11C 13/0007 |
| | | | 365/158 |
| 2005/0057958 A1* | 3/2005 | Miyamoto | G11C 11/22 |
| | | | 365/145 |
| 2007/0097753 A1* | 5/2007 | Choi | G11C 7/1051 |
| | | | 365/189.05 |
| 2016/0027490 A1 | 1/2016 | Muller | |

* cited by examiner

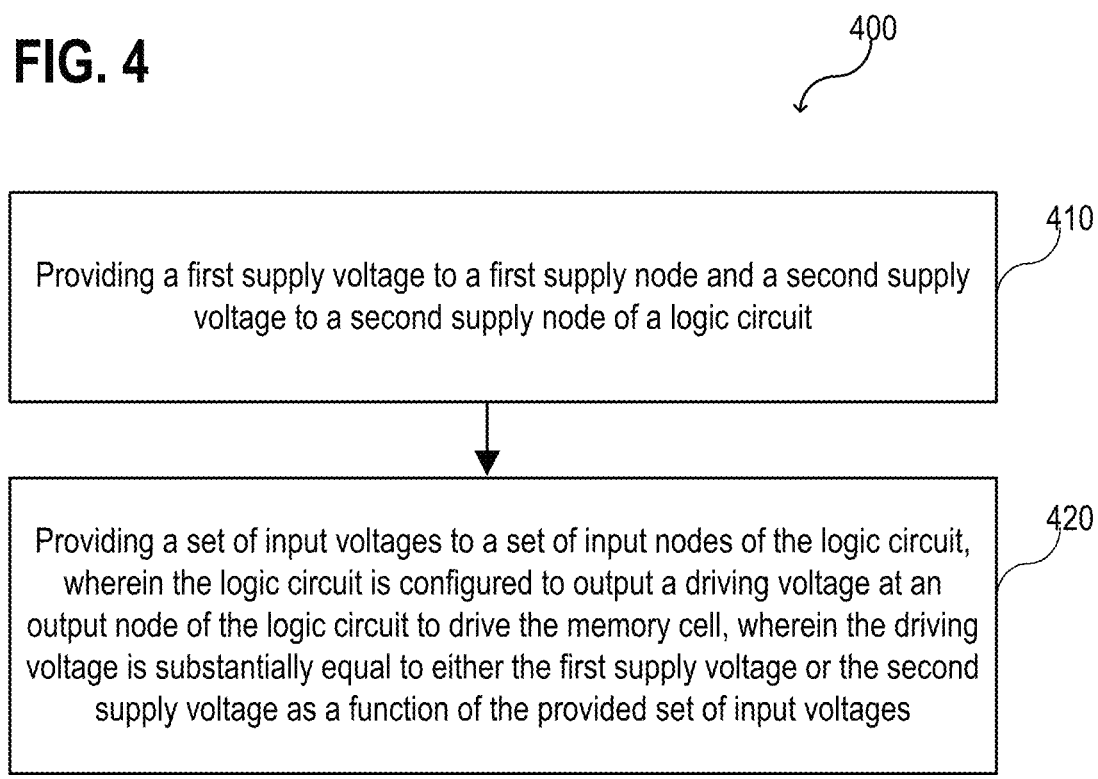

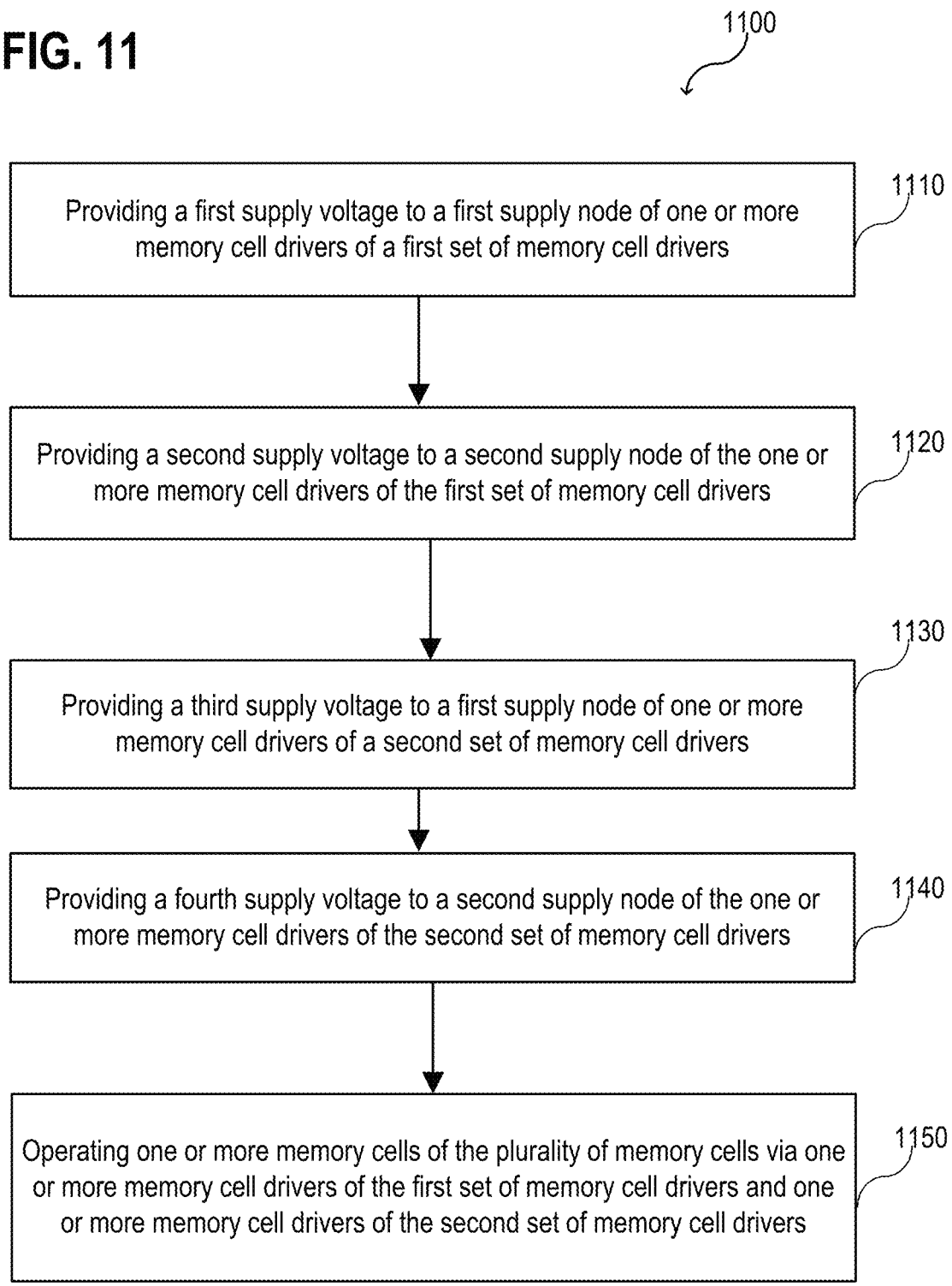

MEMORY CELL DRIVER, MEMORY CELL ARRANGEMENT, AND METHODS THEREOF

CROSS REFERENCE TO RELATED APPLICATIONS

This application claims the benefit of German Patent Application No. 10 2019 111 967.7 filed May 8, 2019, which is incorporated by reference herein in its entirety.

TECHNICAL FIELD

Various embodiments relate to a memory cell driver, a memory cell arrangement, and methods thereof, e.g. a method for operating a memory cell and a method for operating a memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is changed, e.g., in a controlled manner. The information stored in the memory cell may be obtained by determining in which of the memory states the memory cell is. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for programming and/or erasing the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a schematic flow diagram of a method for operating a memory cell, according to various embodiments;

FIG. 11 shows a schematic flow diagram of a method for operating a memory cell arrangement, according to various embodiments.

DESCRIPTION

Figure 1:
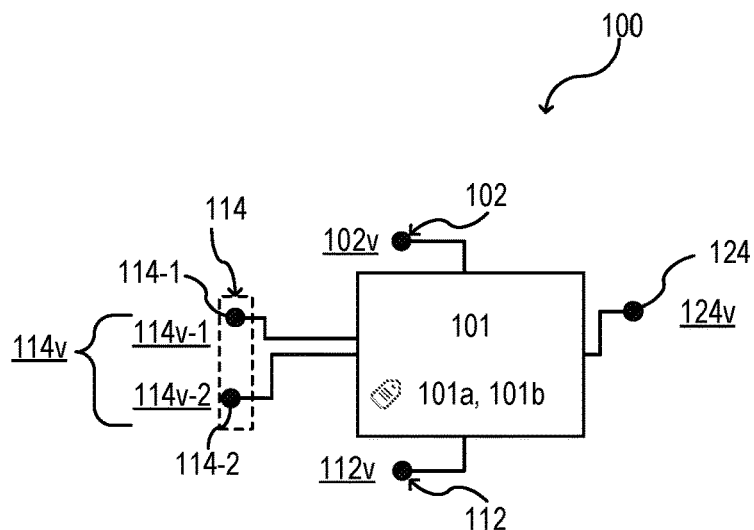
FIG. 1 shows a memory cell driver in a schematic view, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to include at least one element from the group consisting of the elements. For example, the phrase "at least one of" with regard to a group of elements may be used herein to include a selection of: one of the listed elements, a plurality of one of the listed elements, a plurality of individual listed elements, or a plurality of a multiple of listed elements.

The term "connected" may be used herein with respect to nodes, integrated circuit elements, and the like, to include electrically connected, which may include a direct connection or an indirect connection, wherein an indirect connection may only include additional structures in the current path that not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more input voltages", "one or more output voltages", "one or more supply voltages", and the like. It is understood that any voltage (e.g. a positive voltage, a negative voltage, or zero volts may be considered as a voltage, e.g. as a supply voltage. As an example, the term "supply voltage" may be used herein to denote a voltage that is provided to a supply node. As another example, the term "input voltage" may be used herein to denote a voltage that is provided to an input node. Further, the term "output voltage", as example, may be used herein to denote a voltage that is provided to an output node. According to various aspects, the term "substantially equal" may be used herein, for example, with reference to a voltage and/or a comparison of two voltages (e.g. of a supply voltage and an output voltage) to include a deviation of less than 20%, e.g. less than 10%, e.g. less than 5%, e.g. less than 1%.

In some aspects, two voltages may be compared with one another by relative terms such as "greater", "less", or "equal", for example. It is understood that, in some aspects, a comparison may include the sign (positive or negative) of the voltage value or, in other aspects, the absolute voltage values are considered for the comparison. As an example, an n-type (e.g. ferroelectric) field-effect transistor (FET) based memory cell may have a low threshold voltage (LVT) and a high threshold voltage (HVT), wherein the HVT may be greater than the LVT both with respect to the voltage value and the absolute voltage value (e.g. the LVT may be 1 V and the HVT may be 3 V, only as numerical examples) or wherein the HVT may be greater than the LVT only with respect to the voltage value (e.g. the LVT may be −1 V and the HVT may be 1 V, or the LVT may be −2 V and the HVT may be 0 V, or the LVT may be −3 V and the HVT may be −1 V, only as numerical examples). As another example, an p-type (e.g. ferroelectric) field-effect transistor (FET) based memory cell may have a low threshold voltage (LVT) and a high threshold voltage (HVT), wherein the HVT may be lower than the LVT with respect to the voltage value and higher than the LVT with respect to the absolute voltage value (e.g. the LVT may be −1 V and the HVT may be −3 V, only as numerical examples) or wherein the HVT may be lower than the LVT only with respect to the voltage value (e.g. the LVT may be 1 V and the HVT may be −1 V, or the LVT may be 2 V and the HVT may be 0 V, or the LVT may be 3 V and the HVT may be 1 V, only as numerical examples).

According to various aspects, a threshold voltage of a field-effect transistor or a field-effect transistor based memory cell may be a constant-current threshold voltage ($V_{T(ci)}$). In this case, the constant-current threshold voltage ($V_{T(ci)}$) may be a gate-source voltage at which the drain current is equal to a predefined (constant) current ($I_D$). The predefined (constant) current may be a reference current ($I_{D0}$) times the ratio of gate width (W) to gate length (L). The magnitude of the reference current may be selected to be appropriate for a given technology, e.g. 0.1 µA. In some aspects, the constant-current threshold voltage ($V_{T(ci)}$) may be determined based on the following equation:

$$V_{T(ci)} = V_{GS}(\text{at}I_D = I_{D0}W/L).$$

Changing or setting a memory state may be referred to as writing (e.g. programming and/or erasing) the memory cell. In other words, a memory state of one or more memory cells may be changed by one or more write operations. As an example, a first write operation may include changing a memory state of a memory cell from a logic "0" to a logic "1" (also referred to as programming) and a second write operation may include changing a memory state of a memory cell from a logic "1" to a logic "0" (also referred to as erasing). However, the definition of a programming operation and an erase operation may be selected arbitrarily. According to various aspects, a memory cell may have at least two distinct states, e.g. with two distinct electrical conductivities that can be determined to determine in which of the at least two distinct states the memory cell is residing in. As an example, a remanent-polarizable memory cell may include a first memory state, e.g. a low threshold voltage state (LVT), and a second memory state, e.g. a high threshold voltage state (HVT). The high threshold voltage state (HVT) may be associated with a lower current flow during read-out than the low threshold voltage state (LVT). In other words, the low threshold voltage state (LVT) may be an electrically conducting state (e.g. associated with a logic "1") and the high threshold voltage state (HVT) may be an electrically non-conducting (or at least less conducting) state (e.g. associated with a logic "0"). However, the definition of the LVT and the HVT and/or the definition of a logic "0" and a logic "1" may be selected arbitrarily.

In semiconductor industry, the integration of non-volatile memory technologies may be useful for System-on-Chip (SoC) products like microcontrollers (MCU), etc. According to various embodiments, a non-volatile memory may be integrated next to a processor core of a processor. As another example, one or more non-volatile memories may be used as part of a mass storage device.

In general, a non-volatile memory technology may be based on a ferroelectric field-effect transistor (FeFET). As an example, a memory cell may include a field-effect transistor (FET) having a ferroelectric material as a gate insulator. As another example, a memory cell may include a field-effect transistor (FET) and a ferroelectric capacitor structure coupled to a gate electrode of the field-effect transistor to provide a ferroelectric field-effect transistor (FeFET) structure. Since a ferroelectric material has at least two stable polarization states, it may be used to shift a threshold voltage of a field-effect transistor in a non-volatile fashion; and, therefore, it may be used to turn the field-effect transistor into a non-volatile field-effect transistor that stores its state in a non-volatile fashion, when power is removed.

In comparison to other emerging memory technologies, a FeFET based memory cell may be integrated in the Front-End-of-Line (FEoL) and/or in the Back-End-of-Line (BEoL) process flow, since it may be implemented as a transistor-type of memory. Accordingly, the integration of the FeFET based memory cell may comply with a standard FEoL complementary metal-oxide-semiconductor (CMOS) process flow. Consequently, various different integration schemes may be used to integrate a FeFET in different process technologies, e.g., gate-first technologies, gate-last technologies, fully-depleted silicon-on-insulator (FDSOI) technologies, Fin-FET technologies, nanosheet technologies, nanowire technologies, etc.

According to some aspects, FeFET based memory cell may include a plurality of (e.g. two) FeFET structures. This allows, for example, providing a ternary memory cell, e.g. a content-addressable memory (CAM) cell. A ternary memory cell may be based on FeFET structures and, therefore, may be integrated together with one or more logic transistors in a CMOS process flow. The integration of one or more FeFET memory cells on advanced CMOS process platforms may be carried out in a gate-first process technology. However, FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures. According to various aspects, a FeFET based memory cell may be provided with a feature size equal to or less than about 45 nm.

According to various embodiments, a ferroelectric material may be used as part of a memory cell. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various embodiments may be related to a remanently-polarizable layer as memory layer or as a functional part of a memory cell. In general, a remanent polarization (also referred to as retentivity or remanence) may be present in a material layer in the case that the material layer may remain polarized upon reduction of an applied electric field (E) to zero; therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization, e.g., the polarization capability of a material beyond dielectric polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. The polarization capability of a material (e.g., the dielectric polarization, the spontaneous polarization, and/or the remanent polarization) may be analyzed using capacity spectroscopy, e.g., via a static capacitance-voltage measurement and/or time-resolved capacitance-voltage measurements, by polarization-voltage (P-V) measurements, and/or positive-up-negative-down (PUND) measurements.

In general, a FeFET based memory cell array may be operated based on one or more write operations (e.g. program and/or erase operations) and/or one or more read operations. During a write operation, as example, predefined voltages may be applied at electrical lines (also referred to as control lines or driver lines), wherein the electrical lines may be connected to the respective memory cells to allow for the desired operation. The electrical lines may be referred to as word-lines, source-lines, and/or bit-lines, as examples. One approach to program and/or erase a plurality of memory cells may be a one-third (⅓) voltage scheme. Such a ⅓ voltage scheme may realize that one-third of a programming voltage (the programming voltage may be also referred to as write voltage) is only substantially exceeded at nodes corresponding to one or more memory cells that are intended to be programmed or erased. In other words, all memory cells that are not intended to be written may see a voltage that is substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g. to provide the desired write voltages and/or the desired read-out voltages.

In some aspects, a ramping scheme may be used, wherein the supply voltages used to program and/or erase one or more memory cells may be increased by ⅓ and the supply voltages settle after a settling time. However, a conventional scheme may have a comparatively high overall programming time (also referred to as writing time) and may require decoder circuits to handle voltages between zero volts and the full programming voltage (VPP). This may require dedicated transistors for providing the voltages and a higher circuit complexity that in general leads to a comparatively large area consumption while integrating such structures on a chip.

According to various aspects, a memory cell driver is provided that may be used to control one or more operations (e.g. one or more write operations) of one or more memory cells of a memory cell arrangement and that has a simple design. The memory cell driver may be also referred to as memory cell driver circuit (or, abbreviated, as driver circuit). In some aspects, the memory cell driver described herein may be used to efficiently implement a ⅓ VPP scheme, wherein VPP is a programming voltage that may be used for programming and/or erasing the one or more memory cells. The ⅓ VPP scheme may include illustratively providing various voltages during a write operation (e.g. during programing and/or erasing) in such a way that only one or more memory cells of the memory cell arrangement that are intended to be written are actually written. In some aspects, a read-out scheme with corresponding read-out voltages may be used during a read operation. The read-out scheme may be different from the writing scheme, e.g. may include different voltages. According to various aspects, a read-out circuit may be used in addition to a writing circuit, wherein the writing circuit may include a plurality of memory cell drivers as described herein. According to other aspects, a read-out circuit and a writing circuit may be implemented into a single read-out/write circuit, wherein the read-out/write circuit includes a plurality of memory cell drivers as described herein.

In some aspects, a memory cell driver may be implemented based on a number of transistors (e.g. in CMOS technology), wherein a design for a memory cell driver is described herein that is based on a minimal number of transistors. This may lead to a lowest possible circuit complexity. In some aspects, a memory cell driver is provided herein that is implemented with a possibly low number of transistors that leads to less circuit complexity (e.g. compared to transmission gates) and less consumed space on a wafer or a chip.

According to various aspects, a driver circuit for a FeFET based memory cell is provided. In some aspects, a memory cell arrangement is provided that includes a plurality of memory cells (e.g. a plurality of a FeFET based memory cells), wherein a plurality of memory cell drivers is used to drive (in other words to operate or to control an operation of) the memory cell arrangement. According to various aspects, the memory cell drivers may be connected with the plurality of memory cells in an array configuration. As an example, a first set of (m) memory cell drivers and a second set of (n) memory cell drivers may be used to individually address each memory cell of an array A(n,m) with n times m memory cells. It is understood that m may be an integer number greater than two and that n may be an integer number greater than two.

FIG. 1 shows a memory cell driver 100 in a schematic view, according to various embodiments. The memory cell driver 100 may include a logic circuit 101. The memory cell driver 100 may further include a first supply node 102 to receive a first supply voltage 102v and a second supply node 112 to receive a second supply voltage 112v. The memory cell driver 100 may further include a plurality of input nodes 114 to receive a plurality of input voltages 114v. As an example, the memory cell driver 100 may include at least two input nodes 114-1, 114-2 to receive at least two input voltages 114v-1, 114v-2. The memory cell driver 100 may further include an output node 124. As an example, the output node 124 of the memory cell driver 100 may be used to output an output voltage 124v to a single control line (e.g. to a word-line, to a source-line, to a bit-line, etc.). As another example, the output node 124 may be used to output an output voltage 124v to more than one control line (e.g. to both a source-line and a bit-line).

According to various aspects, the plurality of input nodes 114 may be used to control whether the logic circuit 101 is in a first operating state 101a or in a second operating state 101b. Further, the plurality of input nodes 114 may be used to address one or more memory cells connected (e.g. electrically conductively connected) to the output node 124 of the memory cell driver 100.

According to various aspects, the logic circuit 101 may be connected (e.g. electrically conductively connected) to the first supply node 102, the second supply node 112, the plurality of input nodes 114, and the output node 124. In some aspects, the first supply node 102 and the second supply node 112 may be used to supply the respective supply voltages to the logic circuit 101. In some aspects, the plurality of input nodes 114 may be used to provide logic input states to the logic circuit 101 and the output node 124 may be used to output one logic output state via the logic circuit 101 based on the logic operation defined by the logic circuit 101 and on the provided logic input states. The logic input states may be represented by the plurality of input voltages 114v.

According to various aspects, the logic circuit 101 may include one or more logic gates and may be configured to connect (e.g. electrically conductively connect), via the one or more logic gates in response to the plurality of input voltages 114v, either the first supply node 102 or the second supply node 112 to the output node 124. Illustratively, the supply voltages 102v, 112v that are used to operate the logic circuit 101 may be used at the same time to provide an output voltage 124v at the output node 124, wherein the output voltage 124v is similar to either the first supply voltage 102v or the second supply voltage 112v. As an example, a deviation of the output voltage 124v from the respective supply voltage 102v, 112v may be less than 10%, e.g. less than 5%, e.g. less than 1%.

Figure 2A:
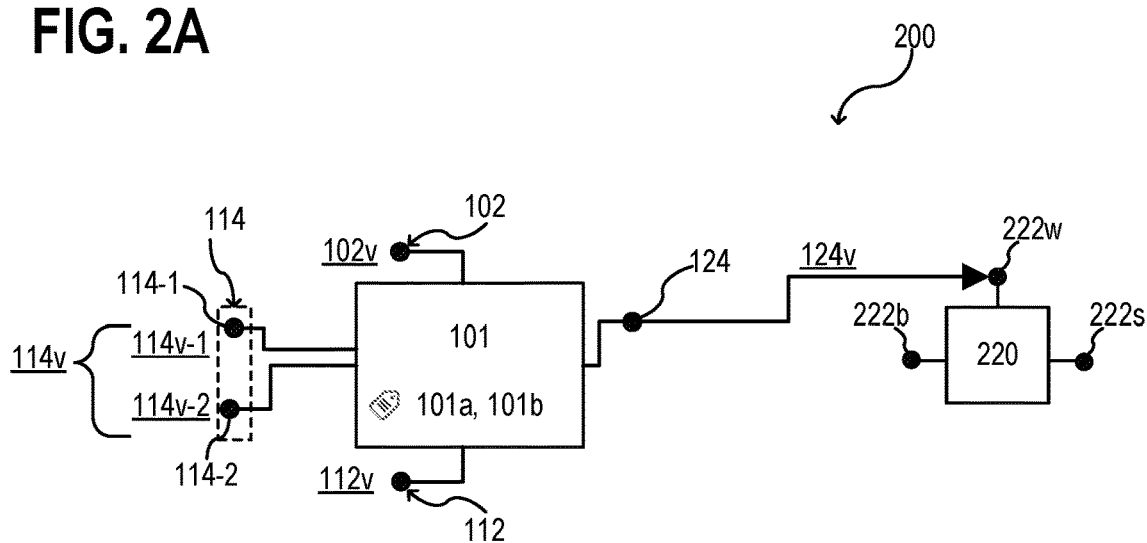
FIG. 2A and FIG. 2B schematically show a memory cell arrangement including a memory cell and a memory cell driver for driving the memory cell, according to various embodiments.

FIG. 2A shows a memory cell arrangement 200 including a memory cell driver 100 and a memory cell 220, wherein the output node 124 of the memory cell driver 100 is (e.g., electrically conductively) connected to a control node 222w of the memory cell 220. According to various aspects, one of the supply voltages 102v, 112v may be used as a driving voltage to operate (e.g., to program and/or erase) the memory cell 220. According to various aspects, no more than either the first supply voltage 102v or the second supply voltage 112v (that may be supplied to the memory cell driver 100) may be supplied to the control node 222w of the memory cell 220 during a writing of the memory cell 220. As illustrated in FIG. 2A, the control node 222w may be a first control node of the memory cell 220, e.g., a word-line node. However, the control node may be any other node of the memory cell 220. According to various aspects, the memory cell 220 may include one or more additional nodes 222s, 222b, e.g., a source-line node 222s and a bit-line node 222b.

Figure 2B:
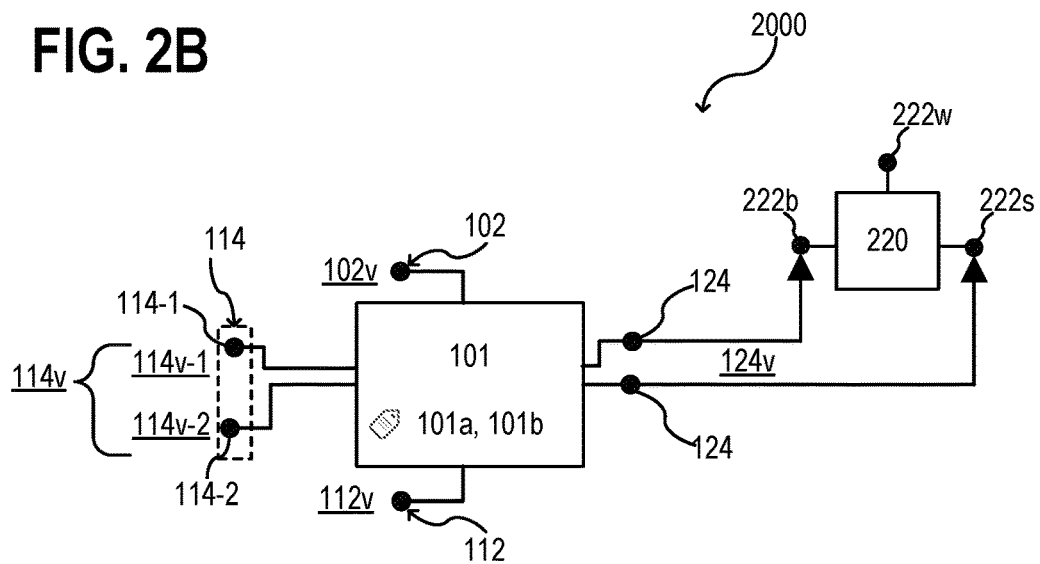

FIG. 2B shows a memory cell arrangement 2000 including the memory cell driver 100 and the memory cell 220, wherein the output node 124 of the memory cell driver 100 is electrically conductively connected to the two control nodes 222s, 222b of the memory cell 220. According to various aspects, one of the supply voltages 102v, 112v may be used as a driving voltage to operate (e.g., to program and/or erase) the memory cell 220. According to various aspects, no more than either the first supply voltage 102v or the second supply voltage 112v (that may be supplied to the memory cell driver 100) may be supplied to the two control nodes 222s, 222b during a writing of the memory cell 220.

The memory cell 220 illustrated in FIG. 2A and FIG. 2B may be a three terminal memory cell, i.e. the memory cell may be operated via three control nodes 222w, 222s, 222b also referred to as word-line node 222w, source-line node 222s, and bit-line node 222b. In the case that the memory cell 220 is a FeFET based memory cell, e.g. in the case that the memory cell 220 includes at least one FeFET to store information, the word-line node 222w may be connected to a gate region (or gate electrode) of the at least one FeFET, the source-line node 222s may be connected to a source region (or source electrode) of the at least one FeFET, and the bit-line node 222b may be connected to a drain region (or drain electrode) of the at least one FeFET.

Figure 3A:
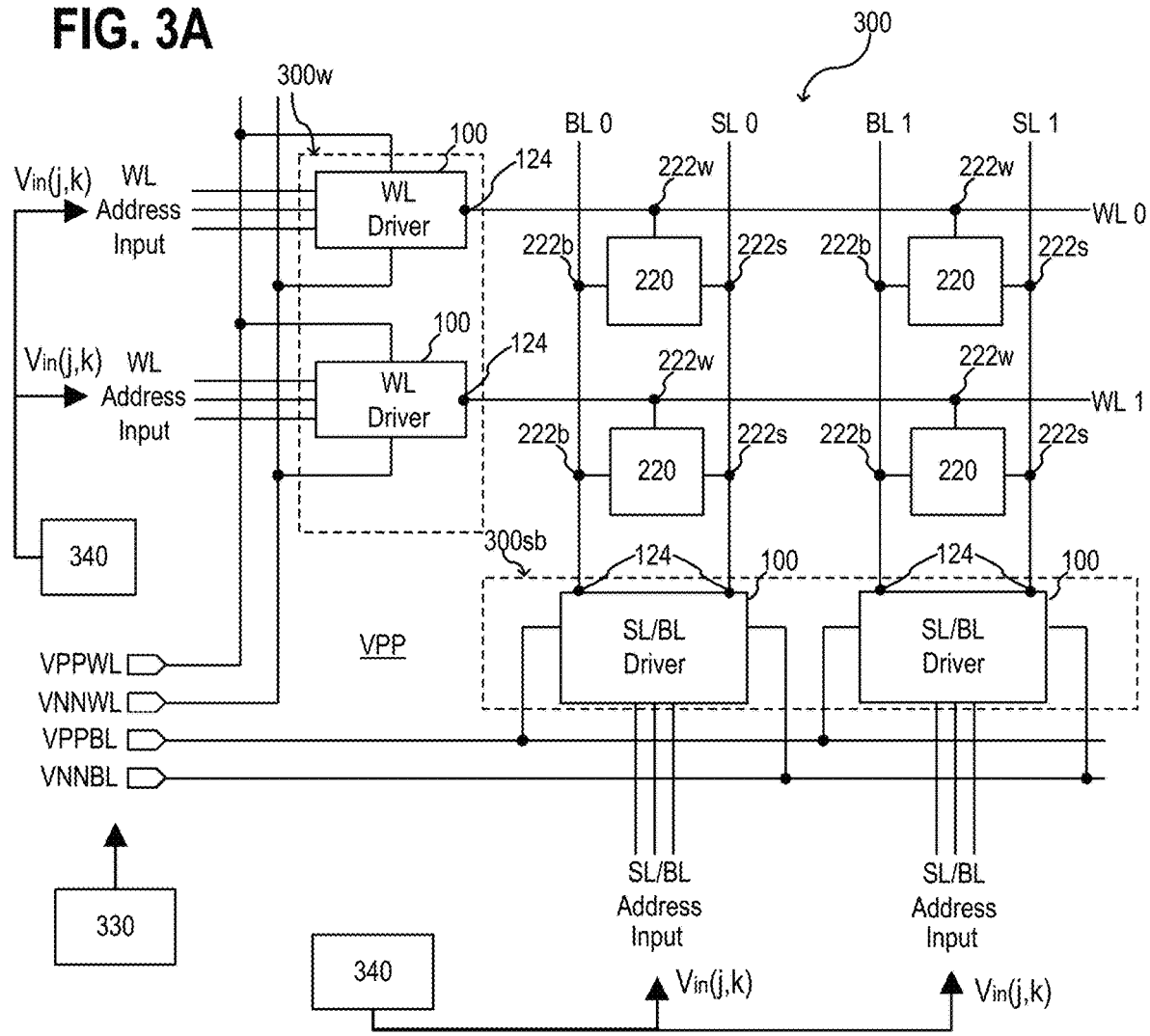
FIG. 3A shows a memory cell arrangement in a schematic view, according to various embodiments.
Figure 3B:
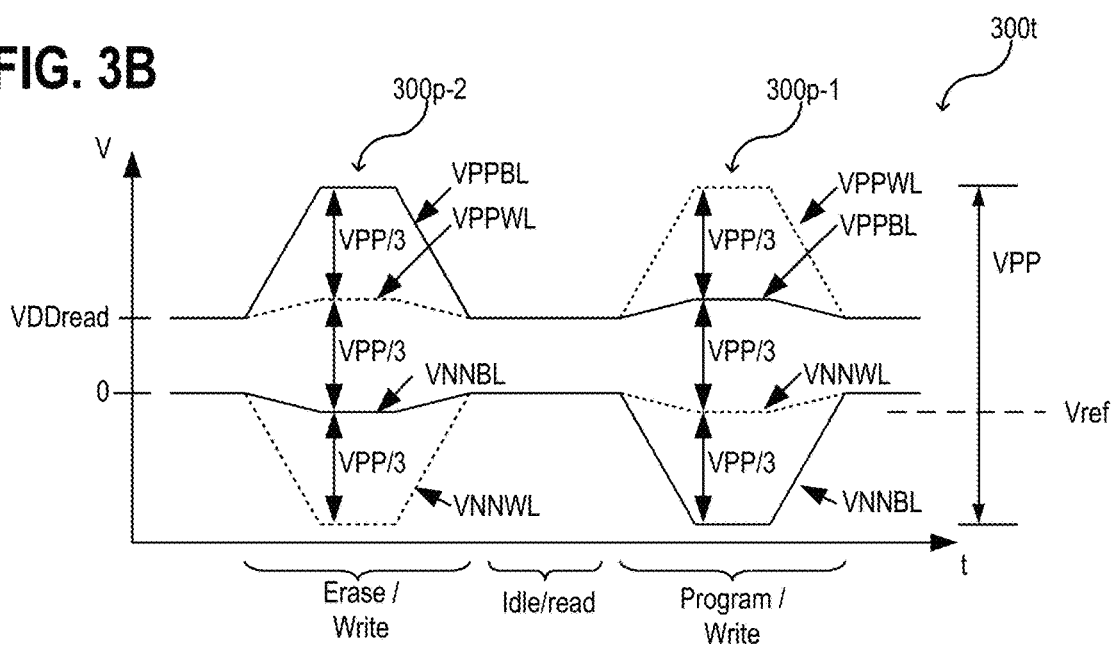
FIG. 3B shows a timing diagram of supply voltages for operating a memory cell arrangement, according to various embodiments.

FIG. 3A shows a memory cell arrangement 300 in a schematic view, according to various embodiments. FIG. 3B shows exemplarily a timing diagram 300t for four supply voltages used to supply memory cell drivers 100 and to operate (e.g. to program and/or erase) the memory cell arrangement 300, according to various aspects. The four supply voltages may include two supply voltages VPPWL, VNNWL associated with word-line drivers (WL Driver) and two supply voltages VPPBL, VNNBL associated with the source/bit-line drivers (SL/BL Driver).

As exemplarily illustrated in FIG. 3A, the memory cell arrangement 300 may include a plurality of memory cell drivers 100 to drive (in other words to operate or to control an operation of, e.g. to program and/or erase) a plurality of memory cells 220. As an example, the memory cell arrangement 300 may include a first set of memory cell drivers 300w and a second set of memory cell drivers 300sb. Each memory cell driver of the memory cell arrangement 300 may be configured, for example, as described herein with reference to the memory cell driver 100.

According to various aspects, the output node 124 of each memory cell driver 100 of the first set of memory cell drivers 300w may be connected to a first control line (WL0, WL1). As an example, the memory cell driver 100 of the first set of memory cell drivers 300w may be a word-line (WL) driver, and each of the word-line drivers may be connected to a word-line (WL). According to various aspects, the output node 124 of each memory cell driver 100 of the second set of memory cell drivers 300sb may be connected to one or more second control lines (SL0, SL1, BL0, BL1). As an example, the memory cell drivers 100 of the second set of memory cell drivers 300sb may be source/bit-line (SL/BL) drivers and each of the source/bit-line drivers may be connected to at least one source-line (SL) and at least one bit-line (BL).

According to various aspects, each memory cell 220 of the memory cell arrangement 300 may include one or more first control nodes 222w and one or more second control nodes 222s, 222b, wherein the one or more first control nodes 222w and the one or more second control nodes 222s, 222b of each of the plurality of memory cells 220 are connected to the one or more first control lines (WL) of a corresponding memory cell driver 100 of the first set of memory cell drivers 300w and the one or more second control lines (SL, BL) of a corresponding memory cell driver 100 of the second set of memory cell drivers 300sb respectively.

FIG. 3A illustrates memory cells 220 that may be operated via three control nodes. As an example, a FeFET based memory cell may include a single FeFET operated via three control nodes, e.g. via a word-line node 222w (also referred to as gate-node) connected to a corresponding word-line (WL) to apply a voltage at the gate of the FeFET, a source-line node 222s (also referred to as source node) connected to a corresponding source-line (SL) to apply a voltage at a source of the FeFET, and a bit-line node 222b (also referred to as drain node) connected to a corresponding bit-line (BL) to apply a voltage at the drain of the FeFET, see, for example, FIG. 5A. As another example, the FeFET based memory cell may include two FeFETs coupled in series or in parallel with one another and operated via four control nodes, e.g. via two word-line nodes to connect each gate of the two FeFETs to a corresponding word-line, a source-line node to connect a source of at least one of the two FeFETs to a source-line, and a bit-line node to connect a drain of at least one of the two FeFETs to a bit-line, see, for example, FIG. 6A and FIG. 6B.

According to various aspects, the number of memory cell drivers 100 that may be used to operate (e.g. to program and/or erase) each memory cell 220 of the memory cell arrangement 300 may be selected as desired. In one configuration, each memory cell 220 of the memory cell arrangement 300 may be connected to one memory cell driver 100 of the first set of memory cell drivers 300w and to one memory cell driver 100 of the second set of memory cell drivers 300sb. A read-out of the memory cells 220 of the memory cell arrangement 300 may be carried out by applying a read-out voltage between the source-line node 222s and the bit-line node 222b of the memory cell 220 and by determining a presence and/or a strength of a resulting current flow there between.

According to various aspects, the memory cell arrangement 300 may include a plurality of memory cells 220, e.g. a plurality of FeFET based memory cells, wherein each memory cell of the plurality of memory cells 220 may be unambiguously addressable via the memory cell drivers 100 of the memory cell arrangement 300. The addressing of the memory cells 220 may be carried out via respectively one memory cell driver 100 of the first set of memory cell drivers 300w (e.g. one of the word-line drivers) and one memory cell driver 100 of the second set of memory cell drivers 300sb (e.g. one of the source/bit-line drivers).

According to various aspects, memory cell arrangement 300 may further include one or more voltage supply circuits 330 (e.g., one or more voltage converters, one or more voltage generators, etc.) to supply a set of two voltages (e.g., VPPWL, VNNWL) to the first set of drivers (e.g., WL drivers) and a second set of two voltages (e.g., VPPBL, VNNBL) to the second set of drivers (e.g., SL/BL drivers). The one or more voltage supply circuits 330 may be configured to generate the first supply voltage VPPWL and the second supply voltage VNNWL for each memory cell driver 100 of the first set of memory cell drivers 300w. The one or more voltage supply circuits 330 may be further configured to generate the first supply voltage VPPBL and the second supply voltage VNNBL for each memory cell driver 100 of the second set of memory cell drivers 300sb.

The respective first supply voltage VPPWL and the respective second supply voltage VNNWL supplied to each memory cell driver 100 of the first set of memory cell drivers 300w may be generated with an offset relative to the respective first supply voltage VPPBL and the respective second supply voltage VNNBL supplied to each memory cell driver 100 of the second set of memory cell drivers 300sb. As an example, the offset may be about ⅓ of the programming voltage VPP. According to various aspects, the supply voltages VPPWL, VNNWL, VPPBL, VNNBL may be provided to the respective memory cell drivers 100 of the memory cell arrangement 300 during programming and/or erasing the respective memory cells 220, e.g., during a write operation. Another voltage regime may be used (e.g., including a read-out voltage VDDread applied between the respective source-line SL and bit-line BL) for a readout of the memory cell. A readout of a FeFET based memory cell may be carried out by applying a readout voltage VDDread between the source and the drain of a FeFET based memory cell and measuring a resulting electrical current flow.

According to various aspects, a memory cell 220 may have (e.g. may define) a programming voltage VPP associated therewith for programming and/or erasing the memory cell 220. As exemplarily illustrated in FIG. 3B, the first supply voltage VPPWL and the second supply voltage VNNWL may be generated for each memory cell driver 100 of the first set of memory cell drivers 300w so that (e.g. during programming and/or erasing) a voltage difference between the first supply voltage VPPWL and the second supply voltage VNNWL is in the range from about 60% to about 72% of the programming voltage VPP. As an example, the voltage difference between the first supply voltage VPPWL and the second supply voltage VNNWL may be about ⅔ of the programming voltage VPP. Further, the first supply voltage VPPBL and the second supply voltage VNNBL may be generated for each memory cell driver 100 of the second set of memory cell drivers 300sb so that (e.g. during programming and/or erasing) a voltage difference between the first supply voltage VPPBL and the second supply voltage VNNBL is in the range from about 60% to about 72% of the programming voltage VPP. As an example, the voltage difference between the first supply voltage VPPBL and the second supply voltage VNNBL may be about ⅔ of the programming voltage VPP.

According to various aspects, the timing diagram 300*t* in FIG. 3B shows a first voltage ramping scheme 300*p*-1 (e.g. a ramping for a first write operation, e.g. a program operation) and a second voltage ramping scheme 300*p*-2 (e.g. a ramping for a second write operation, e.g. an erase operation) of the supply voltages VPPWL, VNNWL, VPPBL, VNNBL. The first voltage ramping scheme 300*p*-1 may provide the programming voltage VPP to the respective memory cells 220 to be programmed or erased. The second voltage ramping scheme 300*p*-2 may provide the inverse programming voltage −VPP to the respective memory cells 220 to be erased or programmed. Via selecting the input voltages $V_{in}$(j,k) it may be defined, which memory cell 220 of the memory cell arrangement 300 is actually programmed or erased, as shown in more detail in FIG. 3C and FIG. 3D. Illustratively, four voltage levels (also referred to as predefined voltage values) may be used for the programming and/or erasing of the memory cells 220.

According to various aspects, the memory cell arrangement 300 may further include one or more addressing circuits 340 configured to provide the plurality of input voltages $V_{in}$(j,k) for each memory cell driver 100 of the first set of memory cell drivers 300*w* and of the second set of memory cell drivers 300*sb*. The one or more addressing circuits 340 may be configured to provide the plurality of input voltages $V_{in}$(j,k) for each memory cell driver 100 of the first set of memory cell drivers 300*w* and each memory cell driver 100 of the second set of memory cell drivers 300*sb* to perform a program operation and/or an erase operation for one or more memory cells 220 of the memory cell arrangement 300.

According to various aspects, before the supply voltages are ramped for one or more write operations, the respective input voltages Vin(j,k) may be applied to the memory cell drivers 100 of the memory cell arrangement 300. This may reduce stress subjected to the transistors of the logic circuits 101 of the memory cell drivers 100 during the one or more write operations.

Figure 3C:
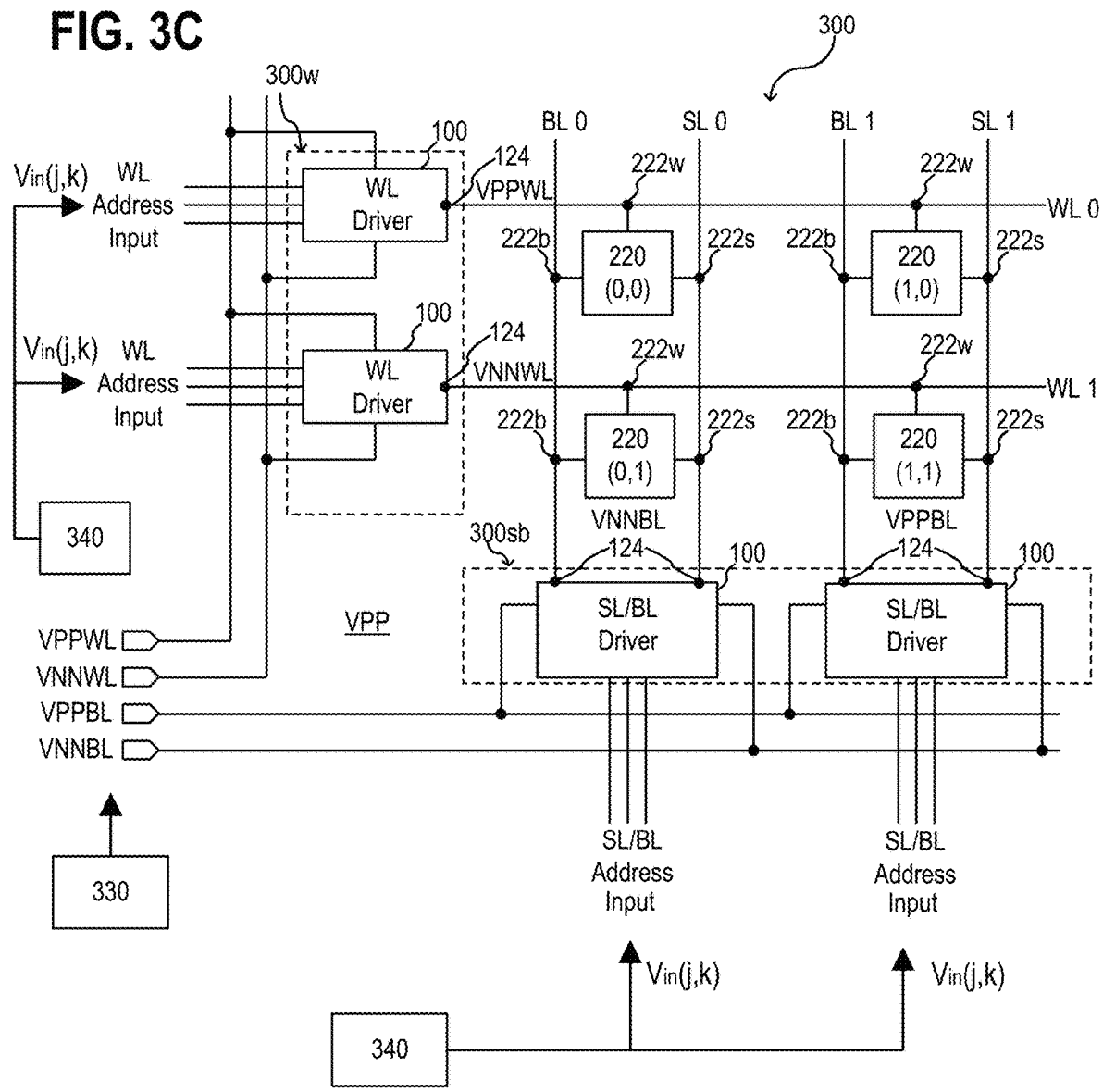
FIG. 3C and FIG. 3D show a memory cell arrangement during a write operation with various supply voltages supplied to the memory cells of the memory cell arrangement via memory cell drivers, according to various embodiments.

FIG. 3C shows the memory cell arrangement 300 and the corresponding supply voltages and output voltages provided during a first write operation (e.g., during a program or erase operation). Via the input voltages Vin(j,k) it may be selected whether VPPWL or VNNWL is output to the respective word-lines WL0, WL1 and whether VPPBL or VNNBL is output to the respective source/bit-lines BL0/SL0, BL1, SL1. During the first write operation, see for example FIG. 3B, VPPWL may be ramped to Vref+2/3 VPP, VNNWL may be ramped to Vref, VPPBL may be ramped to Vref+1/3 VPP, VNNBL may be ramped to Vref- 1/3 VPP. Vref may be a reference voltage (also referred to as reference potential) for the first write operation. In the case that VPPWL is applied to a word-line WL0) via the corresponding word-line driver 100 and VNNBL is applied to a source-line SL0) and a bit-line (e.g., BL0) via the corresponding source/bit-line driver, a memory cell 220 (e.g., the memory cell (0,0)) that receives VPPWL, VNNBL may receive, as a result of the voltage difference between VPPWL and VNNBL, the programming voltage VPP (e.g., with positive polarity) and therefore this memory cell may be programmed or erased. To avoid a programming and/or erasing of all other memory cells 220 (e.g., of the memory cells (1,0), (0,1), and (1,1)), VNNWL is applied to all other word-lines (e.g., WL1) via the corresponding word-line drivers 100 and VPPBL is applied to all other source-lines (e.g., SL1), and all other bit-lines (e.g., BL1) via the corresponding source/bit-line drivers. As a result, all other memory cells 220 (e.g., all except memory cell (0,0)) may receive only one-third of the full programming voltage VPP. As an example, a memory cell 220 (e.g., the memory cell (0,1)) that receives VNNWL, VNNBL may receive, as a result of the voltage difference between VNNWL and VNNBL, one-third of the programming voltage VPP and therefore this memory cell is not programmed and/or erased. As an example, a memory cell 220 (e.g., the memory cell (1,0)) that receives VPPWL, VPPBL may receive, as a result of the voltage difference between VPPWL and VPPBL, one-third of the programming voltage VPP and therefore this memory cell is not programmed and/or erased. As an example, a memory cell 220 (e.g., the memory cell (1,1)) that receives VNNWL, VPPBL may receive, as a result of the voltage difference between VNNWL and VPPBL, one-third of the programming voltage VPP and therefore this memory cell is not programmed and/or erased.

Figure 3D:
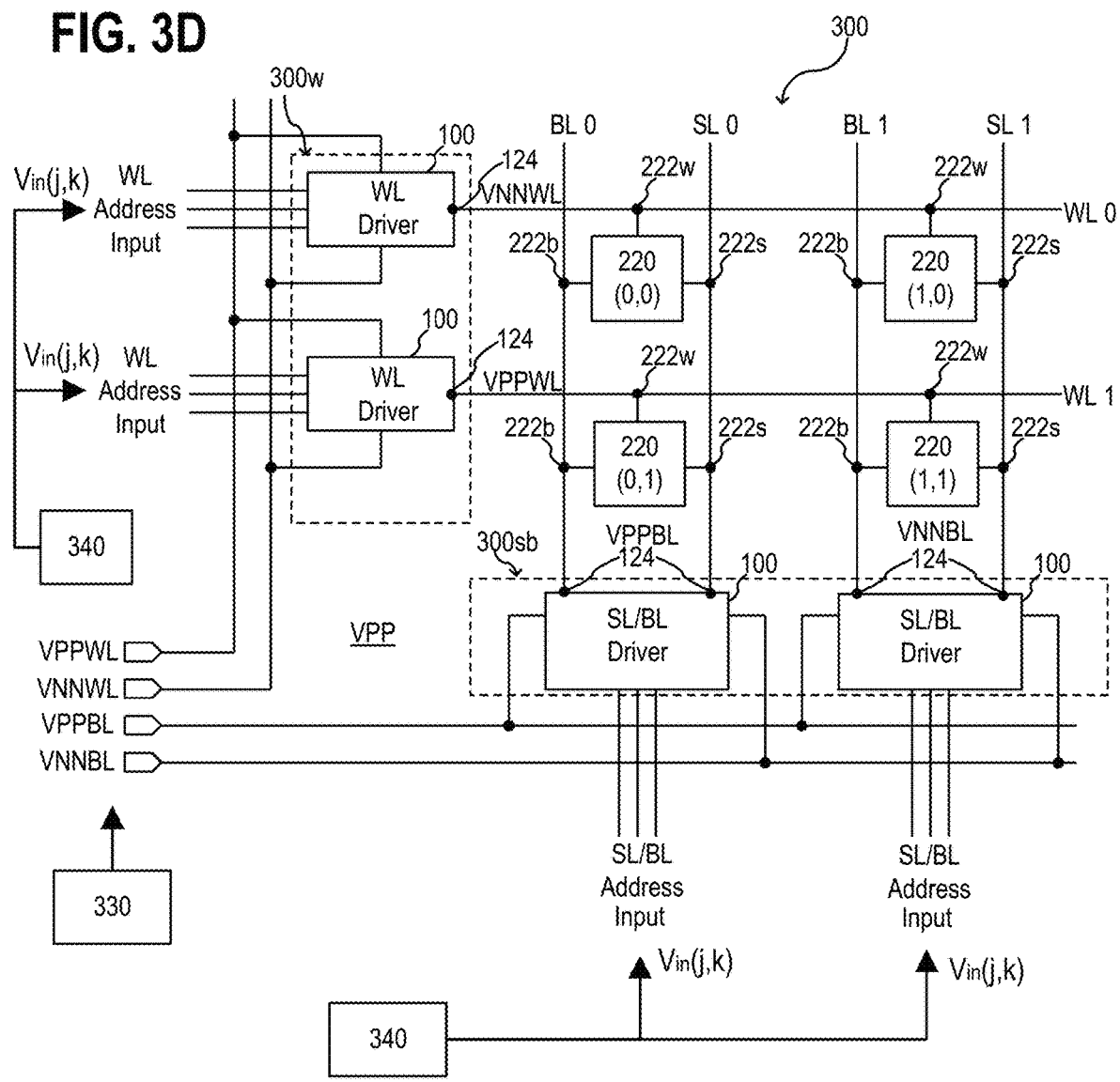

FIG. 3D shows the memory cell arrangement 300 and the corresponding supply voltages and output voltages provided during a second write operation (e.g., during an erase or program operation). Via the input voltages Vin(j,k) it may be selected whether VPPWL or VNNWL is output to the respective word-lines WL0, WL1 and whether VPPBL or VNNBL is output to the respective source/bit-lines BL0/SL0, BL1, SL1. During the second write operation, see for example FIG. 3B, VPPWL may be ramped to Vref+1/3 VPP, VNNWL may be ramped to Vref- 1/3 VPP, VPPBL may be ramped to Vref+2/3 VPP, and VNNBL may be ramped to Vref. Vref may be a reference voltage for the second write operation, e.g., the reference voltage for the second write operation may be equal to the reference voltage for the first write operation. In the case that VNNWL is applied to a word-line (e.g., WL0) via the corresponding word-line driver 100 and VPPBL is applied to a source-line (e.g., SL0) and a bit-line (e.g., BL0) via the corresponding source/bit-line driver, a memory cell 220 (e.g., the memory cell (0,0)) that receives VNNWL, VPPBL may receive, as a result of the voltage difference between VNNWL and VPPBL, the full programming voltage VPP (e.g., with negative polarity) and therefore this memory cell may be erased or programmed. To avoid a programming and/or erasing of all other memory cells 220 (e.g., of the memory cells (1,0), (0,1), and (1,1)), VPPWL is applied to all other word-lines (e.g., WL1) via the corresponding word-line drivers 100 and VNNBL is applied to all other source-lines (e.g., SL1), and all other bit-lines (e.g., BL1) via the corresponding source/bit-line drivers. As a result, all other memory cells 220 (e.g., all except memory cell (0,0)) may receive only one-third of the full programming voltage VPP. As an example, a memory cell 220 (e.g., the memory cell (0,1)) that receives VPPWL, VPPBL may receive, as a result of the voltage difference between VPPWL and VPPBL, one-third of the programming voltage VPP and therefore this memory cell is not programmed and/or erased. As an example, a memory cell 220 (e.g., the memory cell (1,0)) that receives VNNWL, VNNBL may receive, as a result of the voltage difference between VNNWL and VNNBL, one-third of the programming voltage VPP and therefore this memory cell is not programmed and/or erased. As an example, a memory cell 220 (e.g., the memory cell (1,1)) that receives VPPWL, VNNBL may receive, as a result of the voltage difference between VPPWL and VNNBL, one-third of the programming voltage VPP and therefore this memory cell is not programmed and/or erased.

FIG. 4 shows a schematic flow diagram of a method 400 for operating a memory cell (e.g., a memory cell 220 of the memory cell arrangement 200, 2000, 300 as described with reference to FIGS. 2A, 2B, and 3A to 3D), according to various embodiments. The method 400 may include: in 410, providing a first supply voltage (e.g., VPPWL or VPPBL, respectively) to a first supply node (e.g., the first supply node 102) and a second supply voltage (e.g., VNNWL or VNNBL, respectively) to a second supply node (e.g., the second supply node 112) of a logic circuit (e.g., of the logic circuit 101 as described with reference to FIG. 1), depending on the respective set of drivers (e.g., WL drivers or SL/BL drivers); and, in 420, providing a set of input voltages (e.g., Vm(j,k)) to a set of input nodes (e.g., the plurality of input nodes 114) of the logic circuit, wherein the logic circuit is configured to output a driving voltage (e.g., output voltage 124v) at an output node (e.g., output node 124) of the logic circuit to drive the memory cell, wherein the driving voltage may be substantially equal to either the first supply voltage or the second supply voltage for the third supply voltage or the fourth supply voltage, depending on the respective set of drivers) as a function of the provided set of input voltages. Illustratively, the set of input voltages is provided to select, via the logic circuit, one of the two supply voltages as a current driving voltage that is output to the memory cell. The output node may be directly coupled (e.g., electrically conductively connected) to a single control node (e.g., the word-line node 222w) or to two control nodes (e.g., the source-line node 222s and the bit-line node 222b) of the memory cell. According to various aspects, the memory cell may have a programming voltage (VPP) that allows for a programming and/or erasing of the memory cell. The programming and/or erasing of the memory cell may include changing the memory state of the memory cell, also referred to as writing and/or erasing. According to various aspects, during writing (e.g., programming and/or erasing) the memory cell, the voltage difference between the first supply voltage and the second supply voltage supplied to a memory cell driver 100 may be in the range from about 60% to about 72% of the programming voltage. In particular, during writing (e.g., programming and/or erasing) the memory cell, the voltage difference between the first supply voltage and the second supply voltage supplied to a memory cell driver 100 may be about ⅔ of the programming voltage.

Figure 5A:
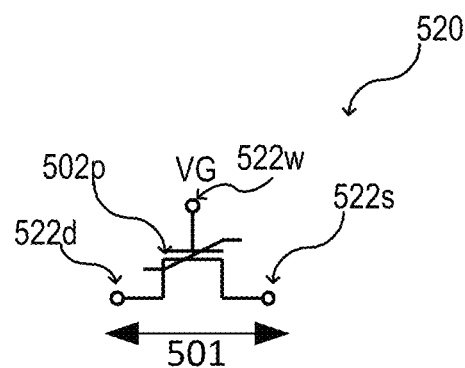
FIG. 5A shows a ferroelectric field-effect transistor that may be used as a memory cell, according to various embodiments.

FIG. 5A illustrates a remanent-polarizable memory cell 520 in a schematic view, according to various embodiments. The remanent-polarizable memory cell 520 may include at least one remanent-polarizable layer 502p, e.g. including or consisting of a remanent-polarizable material. The remanent-polarizable material may be, for example, ferroelectric hafnium oxide. According to various embodiments, the remanent-polarizable memory cell 520 may include a first control node 522w (e.g. a word-line node), a second control node 522s (e.g. a source-line node), and a third control node 522d (e.g. a bit-line node). The remanent-polarizable memory cell 520 may be configured such that an electrical behavior of the second control node 522s and the third control node 522d may be controlled via the first control node 522w. The electrical behavior of the second control node 522s and the third control node 522d may include, for example, an electrical resistance associated with an electrical current flow 501 between the second control node 522s and the third control node 522d. The electrical current flow 501 between the second control node 522s and the third control node 522d may be controlled by controlling a voltage VG (e.g. a gate voltage) that is applied at the first control node 522w. In other words, the electrical current flow 501 between the second control node 522s and the third control node 522d may be varied by varying a gate voltage VG that is applied at the first control node 522w.

The remanent-polarizable memory cell 520 may be a ferroelectric field-effect transistor (FeFET), wherein the second control node 522s may be a first source/drain terminal, the third control node 522d may be a second source/drain terminal, and the first control node 522w may be a gate terminal. In this case, the electrical current flow 501 between the first source/drain terminal and the second source/drain terminal may be controlled by controlling a gate voltage VG that is applied at the gate terminal.

Figure 5B:
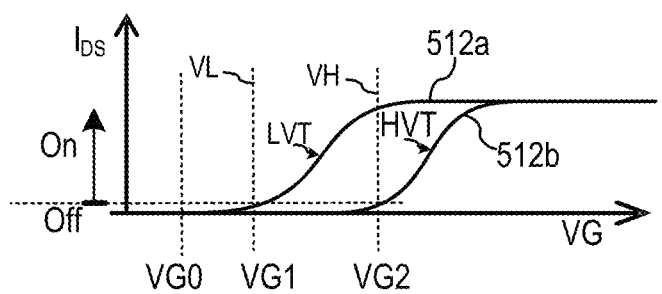
FIG. 5B shows a current/voltage characteristic of a ferroelectric field-effect transistor, according to various embodiments.

FIG. 5B illustrates a schematic current/voltage (I/V) diagram representing an electrical behavior of a remanent-polarizable memory cell 520, according to various embodiments. The remanent-polarizable memory cell 520 may be or may include a ferroelectric field-effect transistor. As an example, the remanent-polarizable memory cell 520 may include a first memory state 512a, e.g. a low threshold voltage state (LVT), and a second memory state 512b, e.g. a high threshold voltage state (HVT). The remanent-polarizable memory cell 520 may be switched between the first memory state 512a and the second memory state 512b by changing the remanent-polarization of the at least one remanent-polarizable layer 502p included in the remanent-polarizable memory cell 520.

For each memory state 512a, 512b, the electrical current flow (see vertical axis IDs) between the second control node 522s and the third control node 522d may be controlled by controlling a control voltage (see horizontal axis VG) that is applied at the first control node 522w. For a FeFET, the control voltage may be referred to as gate voltage, for example. The remanent-polarizable memory cell 520 may have a first threshold voltage VL in the first memory state 512a and a second threshold voltage VH in the second memory state 512b. The first threshold voltage VL may be less than the second threshold voltage VH.

According to various aspects, changing the remanent-polarization of the at least one remanent-polarizable layer 502p may include applying a voltage between the source/drain terminals and the gate terminal that is substantially equal to or greater than the programming voltage. The programming voltage may be selected so that a predefined remanent polarization of the at least one remanent-polarizable layer 502p is caused upon application of the programming voltage.

According to various aspects, erasing a memory cell may be understood as storing a logic "0" in the memory cell and programming a memory cell may be understood as storing a logic "1" in the memory cell. Erasing a memory cell may be also referred to as writing a logic "0" into the memory cell. Programming a memory cell may be also referred to as writing a logic "1" into the memory cell. The programming voltage for storing a logic "0" (also referred to erasing) in the memory cell may have the opposite polarity compared to the programming voltage for storing a logic "1" (also referred to programming) in the memory cell. The logic "1" may be assigned to the first memory state 512a and the logic "0" may be assigned to the second memory state 512b. However, the definition of the states, the logic bit values and/or the terms programming and erasing may be selected arbitrarily.

As an example, in the first memory state 512a, the remanent-polarizable memory cell 520 may be configured to be electrically conductive (also referred to as "on", i.e. allowing a substantial current flow 501 between the second control node 522s and the third control node 522d) in the case that a second (e.g. pre-defined) gate voltage VG1 is applied to the first control node 522w as well as in the case that a third (e.g. pre-defined) gate voltage VG2 is applied to the first control node 522w. Further, in the first memory state 512a, the remanent-polarizable memory cell 520 may be configured to be electrically isolating (also referred to as non-conductive or "off", i.e. preventing a substantial current flow 501 between the second control node 522s and the third control node 522d) in the case that a first (e.g. pre-defined) gate voltage VG0 is applied to the first control node 522w. As illustrated in FIG. 5B, the third gate voltage VG2 may be greater than the second gate voltage VG1, and the second gate voltage VG1 may be greater than the first gate voltage VG0.

Further, in the second memory state 512b, the remanent-polarizable memory cell 520 may be configured to be electrically conductive (also referred to as "on", i.e. allowing a substantial current flow 501 between the second control node 522s and the third control node 522d) in the case that the third gate voltage VG2 is applied to the first control node 522w. Further, in the second memory state 512b, the remanent-polarizable memory cell 520 may be configured to be electrically isolating (also referred to as non-conductive or "off", i.e. preventing a substantial current flow 501 between the second control node 522s and the third control node 522d) in the case that the first gate voltage VG0 is applied to the first control node 522w as well as in the case that the second gate voltage VG1 is applied to the first control node 522w.

Illustratively, the remanent-polarizable memory cell 520 may be switched "on" and "off" at pre-defined control voltages depending on the respective memory state 512a, 512b (LVT, HVT) of the remanent-polarizable memory cell 520. According to various embodiments, a FeFET may be used as remanent-polarizable memory cell 520, wherein a current flow between the source/drain terminals may be substantially zero in the case that the FeFET is "off", e.g. in the case that a control voltage equal to or less than the first threshold voltage VL is applied at the gate terminal of the FeFET in the first memory state 512a and in the case that a control voltage equal to or less than the second threshold voltage VH is applied at the gate terminal of the FeFET in the second memory state 512b. Illustratively, a pre-defined gate voltage VG0, VG1, VG2 is associated with a threshold voltage VL, VH of the remanent-polarizable memory cell 520 (e.g. of a FeFET) in the respective memory state 512a, 512b.

Figure 6A:
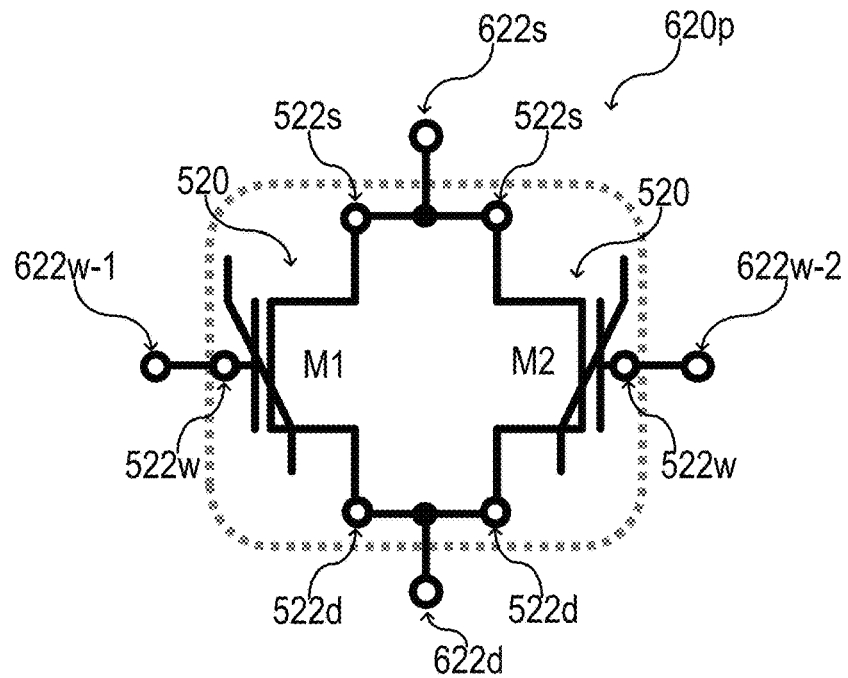
FIG. 6A and FIG. 6B show a ferroelectric field-effect transistor based ternary memory cell, according to various embodiments.

FIG. 6A shows a ternary memory cell 620p in a schematic view, according to various embodiments. Illustratively the ternary memory cell 620p may include or consist of two remanent-polarizable memory cells 520 (e.g. two FeFETs) coupled in parallel with one another.

According to various embodiments, the ternary memory cell 620p may include a first remanent-polarizable memory cell M1 and a second remanent-polarizable memory cell M2. Both remanent-polarizable memory cells M1, M2 may be configured as described herein in FIGS. 5A and 5B with reference to the remanent-polarizable memory cell 520. In other words, the remanent-polarizable memory cell M1 may include a first control node 522w, a second control node 522s, and a third control node 522d to control an electrical behavior of the second control node 522s and the third control node 522d of the first remanent-polarizable memory cell M1. Further, the second remanent-polarizable memory cell M2 may include a first control node 522w, a second control node 522s, and a third control node 522d to control an electrical behavior of the second control node 522s and the third control node 522d of the second remanent-polarizable memory cell M2.

According to various embodiments, the ternary memory cell 620p may include a first control node 622w-1 (e.g. a first lookup-line node) to connect the ternary memory cell 620p to a first control line (e.g. to a first lookup-line). Further, the ternary memory cell 620p may include a second control node 622w-2 (e.g. a second lookup node) to connect the ternary memory cell 620p to a second control line (e.g. to a second lookup-line). In a ternary memory cell arrangement, the respective control nodes 622w-1, 622w-2 of a plurality of ternary memory cells 620p may be connected with one another via a corresponding lookup-line pair; these connected plurality of ternary memory cells 620p may form a first subset of ternary memory cells 620p within the memory cell arrangement. The memory cell arrangement may include a plurality of these first subsets. Each of the first subsets may be used to store a word within the memory cell arrangement. The length of the words may correspond to the number of ternary memory cells 620p in the respective first subset.

The ternary memory cell 620p may include a third control node 622s (e.g. a first match-line node) and a fourth control node 622d (e.g. a second match-line node, also referred to as discharge node) to connect the ternary memory cell 620p to a third control line (e.g. a first match-line) and a fourth control line (e.g. a second match-line, or a discharge-line) respectively. In a ternary memory cell arrangement, the respective control nodes 622s, 622d of a plurality of ternary memory cells 620p may be connected with one another via a corresponding pair of match-lines; these connected plurality of ternary memory cells 620p may form a second subset of ternary memory cells 620p within the memory cell arrangement. The memory cell arrangement may include a plurality of these second subsets. Each ternary memory cell 620p of the memory cell arrangement may be part of one specific first subset and one specific second subset. Illustratively, the ternary memory cells 620p of a memory cell arrangement may be arranged in any array that allows the desired addressing of the ternary memory cells 620p.

According to various embodiments, the second control node 522s of the first remanent-polarizable memory cell M1 and the second control node 522s of the second remanent-polarizable memory cell M2 may be electrically connected to the first match line node 622s. According to various embodiments, the third control node 522d of the first remanent-polarizable memory cell M1 and the third control node 522d of the second remanent-polarizable memory cell M2 may be electrically connected to the second match line node 622d.

Figure 6B:
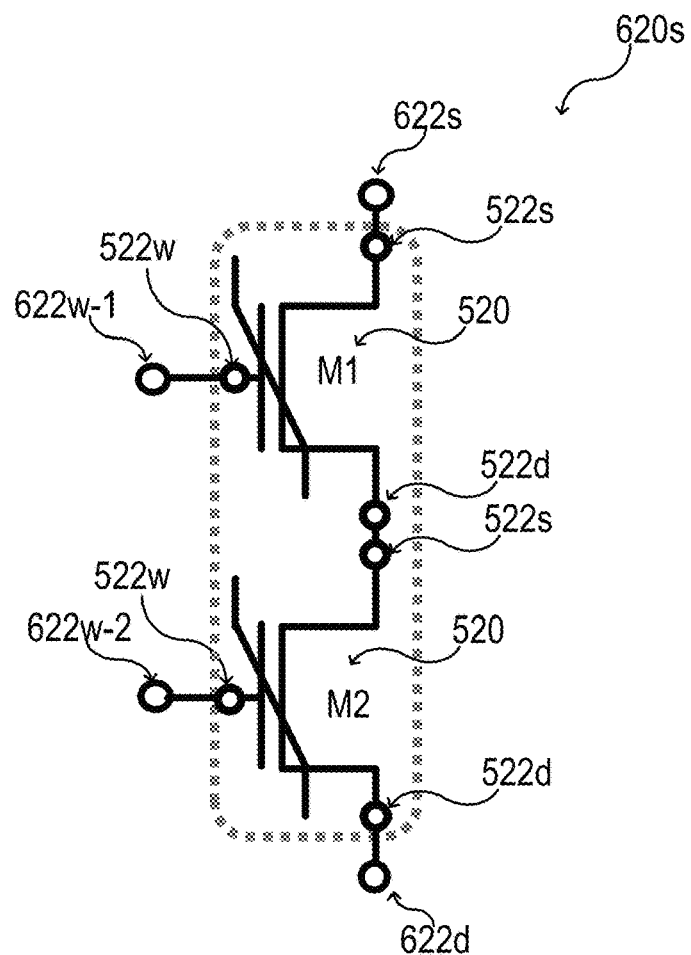

As another example, two remanent-polarizable memory cells 520 (e.g. two FeFETs) may be used in series (e.g. in a NAND configuration) to provide a ternary memory cell 620s, as illustrated in FIG. 6B. The series connection of the two remanent-polarizable memory cells 520 may allow discharging a first match line to a second match line only if both of the two remanent-polarizable memory cells 520 are conducting. The discharge of the first match line may be associated with a mismatch. A match may be detected only if none or only one of the remanent-polarizable memory cells 520 is conducting, or in other words, if the first match line remains pre-charged. However, the NOR configuration, e.g. as described above, allows to use low lookup voltages to, for example, avoid a read disturb. Illustratively, lookup voltages less than the second threshold voltage VH may be used in the NOR configuration.

According to various aspects, the ternary memory cell 620p, 620s may be addressed via the four nodes 622w-1, 622w-2, 622s, 622d. In a memory cell arrangement, a plurality of ternary memory cells 620p, 620s may be individually addressable via their respective nodes 622w-1, 622w-2, 622s, 622d. Each of the four nodes 622w-1, 622w-2, 622s, 622d may be connected to an output 124 of a memory cell driver 100. As an example, four memory cell drivers 100 may be used to program and/or erase the ternary memory cells 620p, 620s of a ternary memory cell arrangement.

Figure 7A:
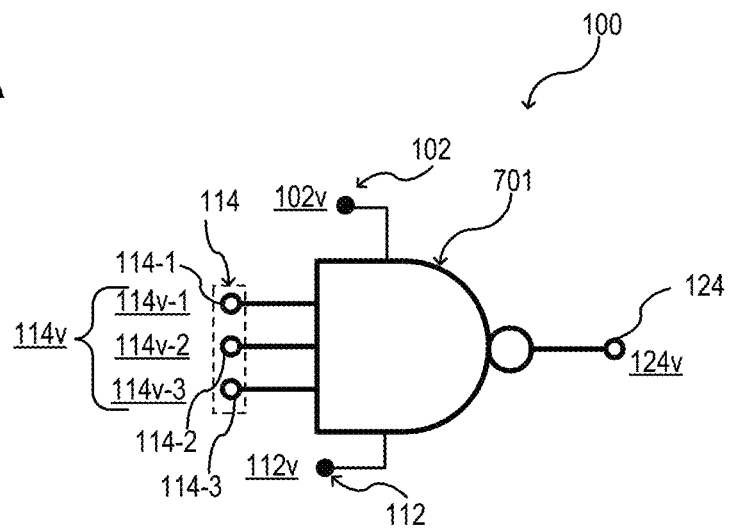
FIG. 7A and FIG. 7B show a memory cell driver including a NAND logic circuit, according to various embodiments.
Figure 7B:
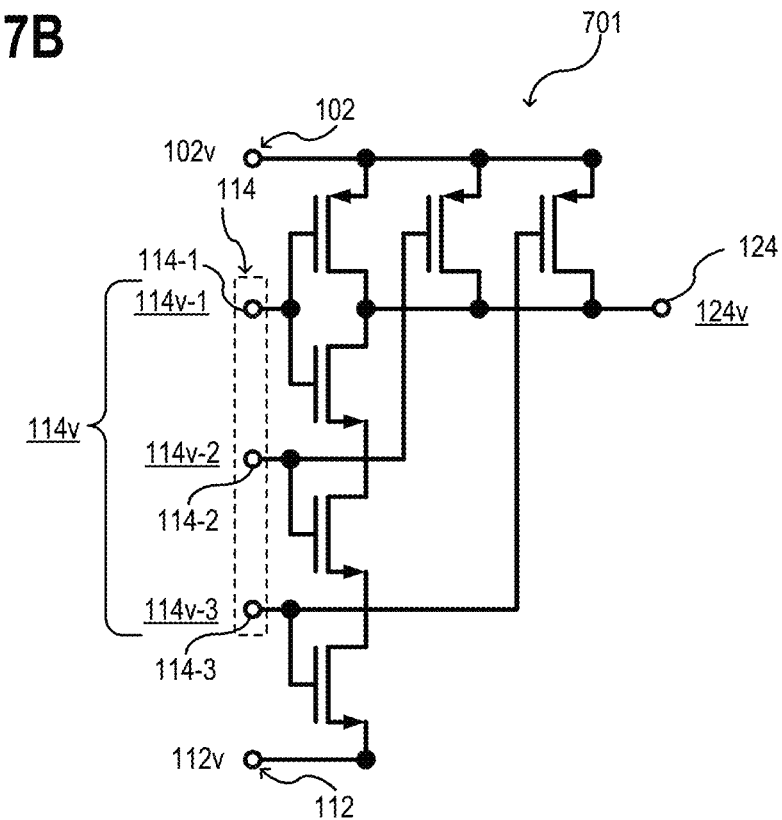

FIG. 7A shows a memory cell driver 100 based on a multi-input NAND logic circuit 701 in a schematic view, according to various embodiments. FIG. 7B shows a circuit diagram of the multi-input NAND logic circuit 701, as an example.

According to various aspects, the logic circuit 101 of the memory cell driver 100 illustrated, for example, in FIG. 1 may include a multi-input NAND logic circuit 701. In some aspects, not more than one multi-input logic circuit may be used to provide the desired functions of the memory cell driver 100 described herein.

According to various aspects, a three-input NAND logic circuit 701 is illustrated in FIGS. 7A and 7B; however, an n-input with n=2, n=3, or n>3 may be used in a similar way. A set of n input voltages 114v may be used accordingly. As an example (e.g. for n=3), three input voltages 114v-1, 114v-2, 114v-3 may be provided accordingly to the three input nodes 114-1, 114-2, 114-3. According to various aspects, the logic circuit 701 of the memory cell driver 100 may be provided in CMOS technology, as illustrated, for example, in FIG. 7B.

According to various aspects, instead of a multi-input NAND logic circuit 701 a multi-input AND logic circuit may be used in the same or in a similar way.

Figure 8A:
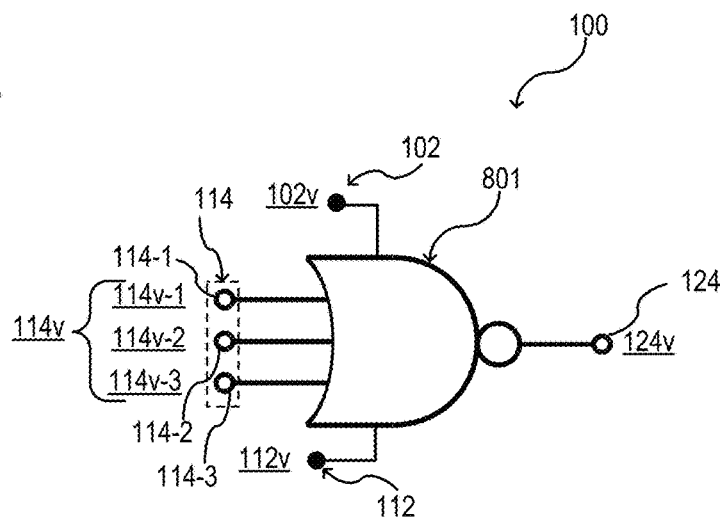
FIG. 8A and FIG. 8B show a memory cell driver including a NOR logic circuit, according to various embodiments.
Figure 8B:
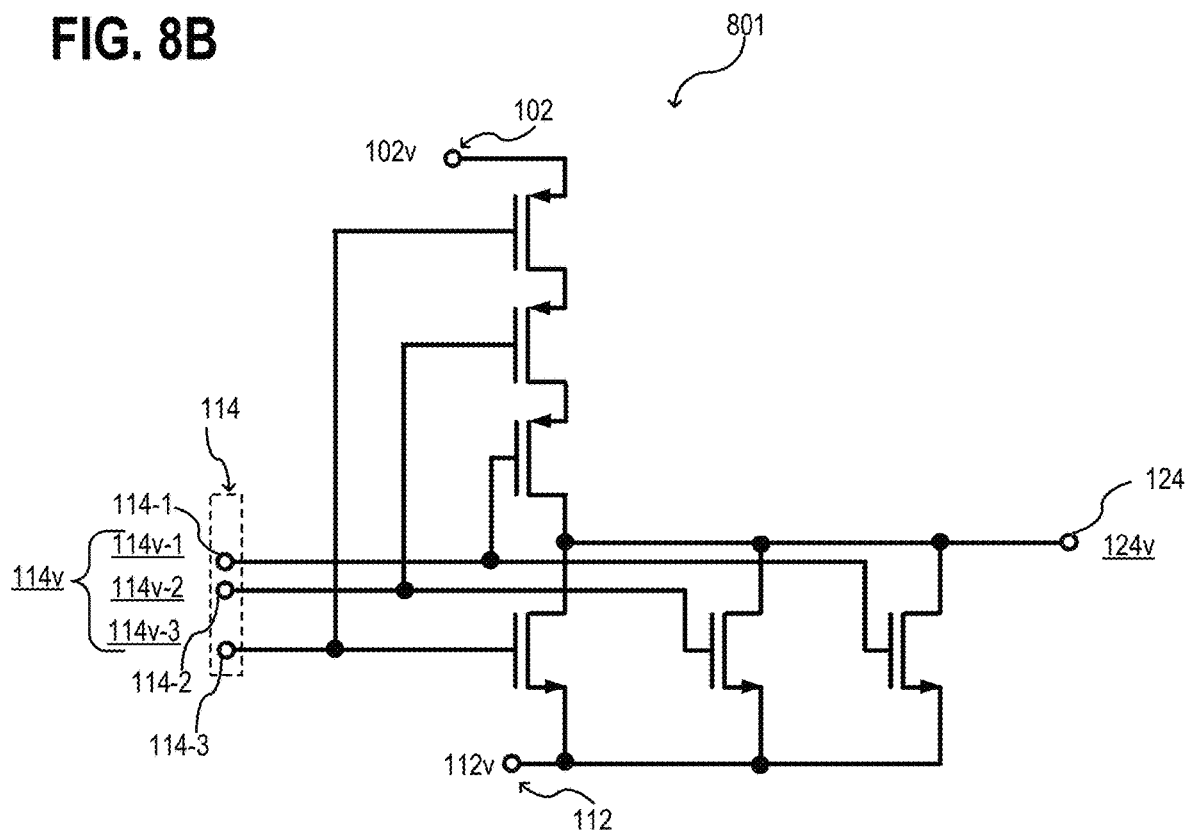

FIG. 8A shows a memory cell driver 100 based on a multi-input NOR logic circuit 801 in a schematic view, according to various embodiments. FIG. 8B shows a circuit diagram of the multi-input NOR logic circuit 801, as an example.

According to various aspects, the logic circuit 101 of the memory cell driver 100 illustrated, for example, in FIG. 1 may include a multi-input NOR logic circuit 801. In some aspects, not more than one multi-input logic circuit may be used to provide the desired functions of the memory cell driver 100 described herein.

According to various aspects, a three-input NOR logic circuit 801 is illustrated in FIGS. 8A and 8B; however, an n-input with n=2, n=3, or n>3 may be used in a similar way. A set of n input voltages 114v may be used accordingly. As an example (e.g. for n=3), three input voltages 114v-1, 114v-2, 114v-3 may be provided accordingly to the three input nodes 114-1, 114-2, 114-3. According to various aspects, the logic circuit 801 of the memory cell driver 100 may be provided in CMOS technology, as illustrated, for example, in FIG. 8B.

According to various aspects, instead of a multi-input NOR logic circuit 801 a multi-input OR logic circuit may be used in the same or in a similar way.

Figure 9A:
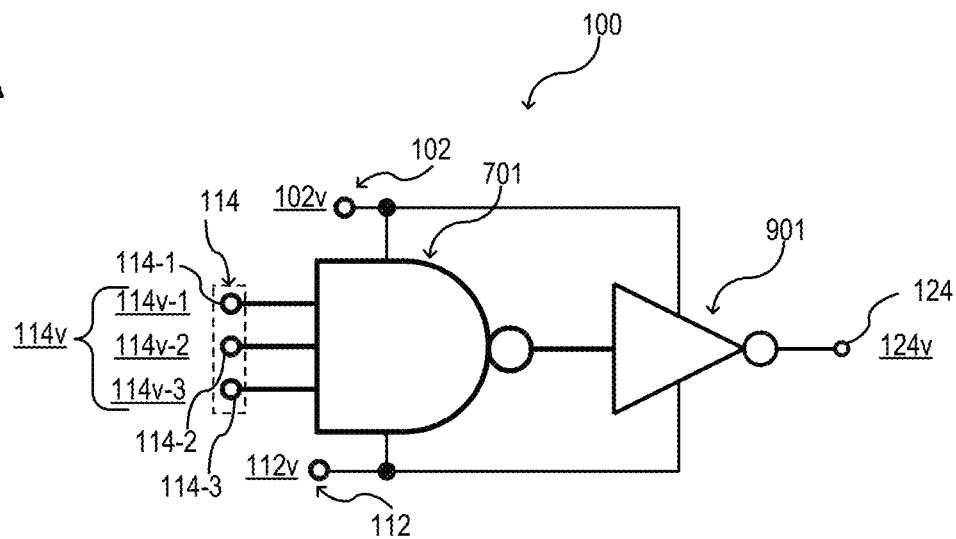
FIG. 9A and FIG. 9B show a memory cell driver including a logic NAND circuit and an logic inverter circuit, according to various embodiments.
Figure 9B:
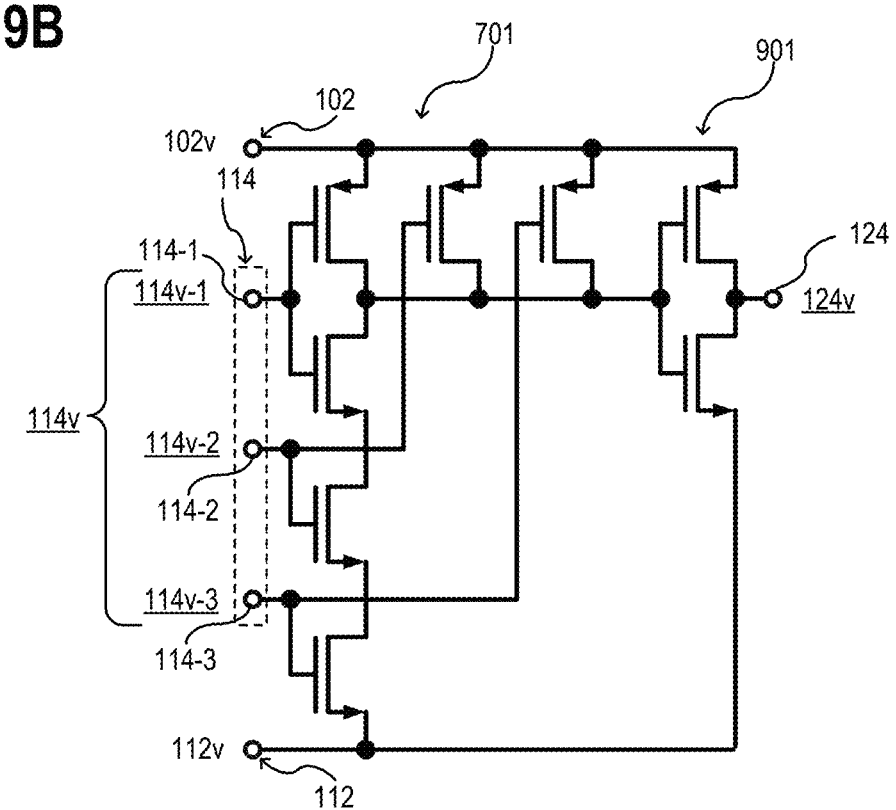

According to various aspects, the NAND logic circuit 701 (and in analogy the NOR logic circuit 801) may additionally include one or more single-input logic circuits, e.g. an inverter and/or one or more buffer. FIG. 9A and FIG. 9B show a memory cell driver 100, wherein the logic circuit 101 of the memory cell driver 100 includes a NAND logic circuit 701 (as described with reference to FIGS. 7A and 7B) and, additionally, an inverter circuit 901. The inverter circuit 901 may be supplied by the same supply voltages 102v, 112s as the logic circuit 701 and the output of the NAND logic circuit 701 is inverted by the inverter circuit 901.

Figure 10A:
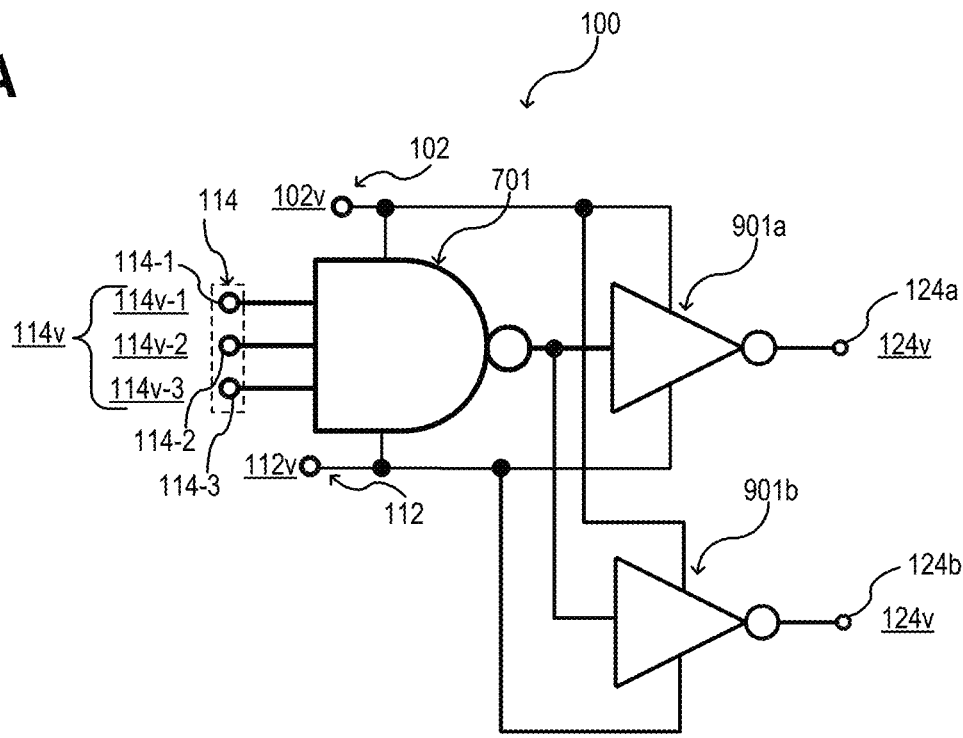
FIG. 10A and FIG. 10B show a memory cell driver including a logic NAND circuit and two logic inverter circuits, according to various embodiments.
Figure 10B:
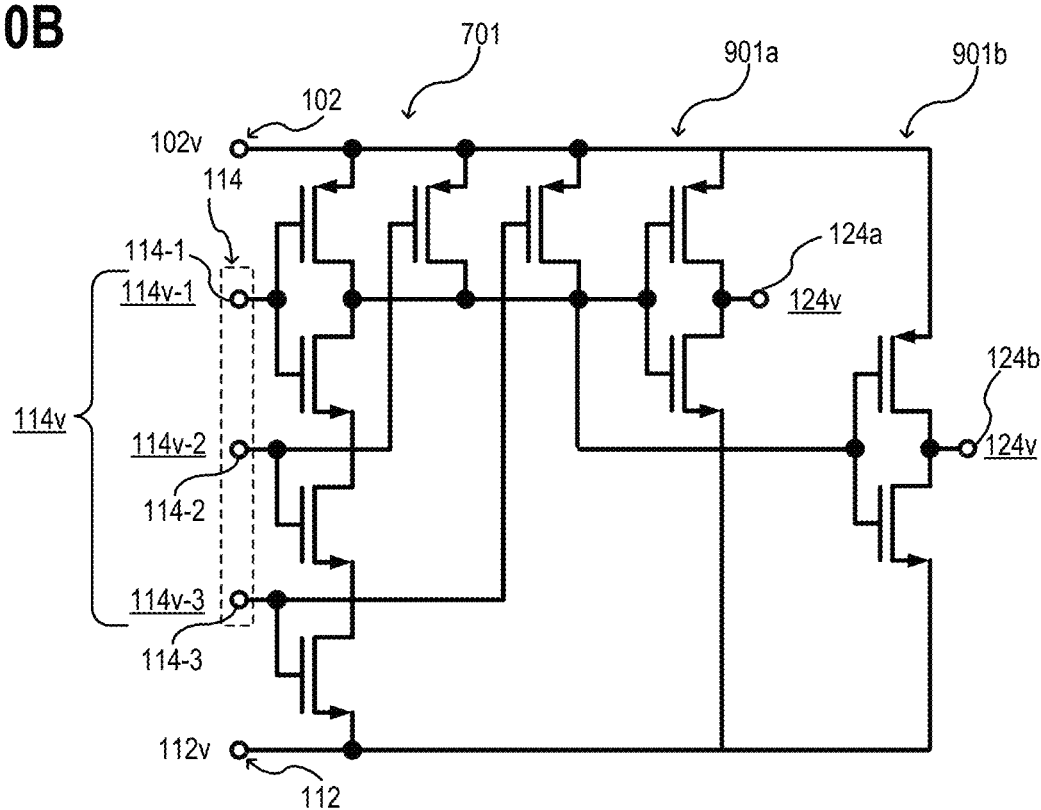

According to various aspects, the NAND logic circuit 701 (and in analogy the NOR logic circuit 801) may additionally include two inverter to output the output voltage 124v to two control lines, e.g. to both a source-line and a bit-line. FIG. 10A and FIG. 10B show a memory cell driver 100, wherein the logic circuit 101 of the memory cell driver 100 includes a NAND logic circuit 701 (as described with reference to FIGS. 7A, 7B, 9A, and 9B) and, additionally, two inverter circuits 901a, 901b. The inverter circuits 901a, 901b may be supplied by the same supply voltages 102v, 112s as the logic circuit 701 and the output of the NAND logic circuit 701 is inverted by each of the inverter circuits 901a, 901b. Illustratively, the memory cell driver 100 may have two output nodes 124a, 124b to output the output voltage 124v to two control lines, e.g. to a source-line and to a bit-line.

FIG. 11 shows a schematic flow diagram of a method 1100 for operating a memory cell arrangement, according to various embodiments. The memory cell arrangement may include a plurality of memory cells, e.g. a plurality of memory cells 220 as described above with reference to the memory cell arrangement 300. According to various aspects, the method 1100 may include: in 1110, providing a first supply voltage VPPWL to a first supply node 102 of one or more memory cell drivers 100 of a first set of memory cell drivers 300w; in 1120, providing a second supply voltage VNNWL to a second supply node 112 of the one or more memory cell drivers 100 of the first set of memory cell drivers 300w; in 1130, providing a third supply voltage VPPBL to a first supply node 102 of one or more memory cell drivers 100 of a second set of memory cell drivers 300sb; in 1140, providing a fourth supply voltage VNNBL to a second supply node 112 of the one or more memory cell drivers 100 of the second set of memory cell drivers 300sb; and, in 1150, operating one or more memory cells of the plurality of memory cells 220 via one or more memory cell drivers 100 of the first set of memory cell drivers 300w and one or more memory cell drivers 100 of the second set of memory cell drivers 300sb. Operating the one or more memory cells may include, for example, providing, for each memory driver 100 of the first set of memory cell drivers 300w, a plurality of input voltages to the plurality of input nodes 114 to control the memory driver 100 to output either the first supply voltage VPPWL or the second supply voltage VNNWL to the respective one or more first control lines WL; and/or providing, for each memory driver 100 of the second set of memory cell drivers 300sb, a plurality of input voltages to the plurality of input nodes 114 to control the memory driver 100 to output either the third supply voltage VPPBL or the fourth supply voltage VNNBL to the respective one or more second control lines SL, BL, see, for example, FIG. 3C and FIG. 3D.

According to various aspects, a FeFET memory driver circuitry (referred to as memory cell driver 100) is provided. The FeFET memory driver circuitry may be built with logic gates (e.g. based on AND gates and one or more inverter gates). The FeFET memory driver circuitry has a comparatively low circuit complexity. The transistors of the FeFET memory driver circuitry may be dimensioned to handle only $\frac{2}{3}$ of the full programming voltage VPP. This saves, for example, area on a chip or wafer comparted to the same circuitry that has to handle the full programming voltage VPP. According to various aspects, two different voltage domains (VPPWL, VNNWL and VPPBL, VNNBL) can be used for the word-line drivers and the source/bit-line drivers. The voltage domains (VPPWL, VNNWL and VPPBL, VNNBL) may be shifted relative to one another by $\frac{1}{3}$ of the programming voltage VPP. Various embodiments may be related to a remanent-polarizable layer or a remanent-polarizable material, however, the term "remanent-polarizable" may be understood as "spontaneously-polarizable" and vice versa.

In the following, various examples are provided that may include one or more aspects described above with reference to the memory cell driver 100, the memory cell arrangement 200, 2000, 300 and methods thereof.

Example 1 is a memory cell driver 100 including: a first supply node 102 to receive a first supply voltage 102v and a second supply node 112 to receive a second supply voltage 112v, a plurality of input nodes 114 to receive a plurality of input voltages 114v, one or more output nodes 124, and a logic circuit 101 connected to the first supply node 102, the second supply node 112, the plurality of input nodes 114, and the one or more output nodes 124, wherein the logic circuit 101 includes one or more logic gates and is configured to connect via the one or more logic gates either the first supply node 102 or the second supply node 112 to the one or more output nodes 124 in response to the plurality of input voltages 114v.

In example 2, the memory cell driver 100 of example 1 may optionally include that the logic circuit 101 is configured to provide an output voltage 124v at each of the one or more output nodes 124 by connecting the first supply node 102 to the one or more output nodes 124 so that the output voltage 124v is substantially the same as the first supply voltage 102v.

In example 3, the memory cell driver 100 of example 1 or 2 may optionally include that the logic circuit 101 is configured to provide an output voltage 124v at each of the one or more output nodes 124 by connecting the second supply node 112 to the one or more output nodes 124 so that the output voltage 124v is substantially the same as the second supply voltage 112v.

In example 4, the memory cell driver 100 of any one of examples 1 to 3 may optionally include that the one or more logic gates implement a Boolean function.

In example 5, the memory cell driver 100 of example 4 may optionally include that the Boolean function has an arity of two. A Boolean function having an arity of two may be also referred to as a binary Boolean function. The Boolean function may include AND, OR, NAND, NOR, as examples.

In example 6, the memory cell driver 100 of example 4 or 5 may optionally include that each input voltage 114-1, 114-2, 114-3 of the plurality of input voltages 114 represents one of at least two input values of the Boolean function. Illustratively, a binary data type is used that may include one of two possible values usually denoted as "true" and "false" or "1" and "0" and that represents the two truth values of logic and Boolean algebra. The Boolean algebra may be implemented as electronic circuit including one or more logic gates. One or more logic gates may implement one or more Boolean functions (also referred to as Boolean operators).

In example 7, the memory cell driver 100 of example 6 may optionally include that the output voltage 124v provided at the one or more output nodes 124 represents one of two output values of the Boolean function. The respective output value of the Boolean function may be defined by the plurality of input voltages and the Boolean function.

In example 8, the memory cell driver 100 of any one of examples 1 to 7 may optionally include that the one or more logic gates include an n-input logic gate. As an example, n may be an integer number greater than one. Particularly, the one or more logic gates may include no more than one n-input logic gate.

In example 9, the memory cell driver 100 of example 8 may optionally include that the n-input logic gate is one of the following logic gates: an n-input AND gate, an n-input NAND gate, an n-input OR gate, or an n-input NOR gate.

In example 10, the memory cell driver 100 of example 8 or 9 may optionally include that the plurality of input nodes 114 are a number of n input nodes corresponding to the n-input logic gate.

In example 11, the memory cell driver 100 of any one of examples 1 to 10 may optionally include that the one or more logic gates include one or more single-input logic gates in addition to at least one multi-input logic gate.

In example 12, the memory cell driver 100 of example 11 may optionally include that the one or more single-input logic gates include one or more buffer gates. A buffer gate may be used, for example, to add a delay.

In example 13, the memory cell driver 100 of example 11 or 12 may optionally include that the one or more single-input logic gates include one or more NOT gates. A NOT gate may be also referred to an inverter.

Example 14 is a memory cell arrangement 200, 2000, 300, including a memory cell driver 100 of any one of examples 1 to 13. The memory cell arrangement 200, 2000, 300 may further include one or more memory cells 220, wherein one or more control nodes of each of the one or more memory cells 220 may be (e.g., electrically conductively) connected to one or more output nodes 124 of the memory cell driver 100.

Example 15 is a method of operating a memory cell, the method including: providing a first supply voltage to a first supply node of a logic circuit; providing a second supply voltage to a second supply node of the logic circuit; and providing a set of input voltages to a set of input nodes of the logic circuit, wherein the logic circuit is configured to output a driving voltage at an output node of the logic circuit in response to the provided set of input voltages to operate the memory cell, wherein the driving voltage is substantially equal to either the first supply voltage or the second supply voltage.

In example 16, the method of example 15 may optionally include that the memory cell defines a programming voltage VPP for writing (e.g., programming and/or erasing) the memory cell 220. Further, a difference between the first supply voltage and the second supply voltage may be in the range from about 60% to about 72% of the programming voltage VPP. In particular, a difference between the first supply voltage and the second supply voltage may be substantially two-thirds (⅔) of the programming voltage VPP.

According to various aspects, the memory cell (e.g. of examples 14 to 16) may be or may include a ferroelectric field-effect transistor (FeFET). According to various aspects, the memory cell (e.g. of examples 14 to 16) may include more than one ferroelectric field-effect transistor (FeFET).

Example 17 is a memory cell arrangement 300, including: a first set of memory cell drivers 300w and a second set of memory cell drivers 300sb. Each memory driver 100 of the first and second set of memory cell drivers 300w, 300sb includes: a first supply node 102 to receive a first supply voltage 102v and a second supply node 112 to receive a second supply voltage 112v, a plurality of input nodes 114 to receive a plurality of input voltages 114v, one or more output nodes 124, and a logic circuit 101 connected to the first supply node 102, the second supply node 112, the plurality of input nodes 114, and the one or more output nodes 124, wherein the logic circuit 101 includes one or more logic gates and is configured to connect via the one or more logic gates either the first supply node 102 or the second supply node 112 to the one or more output nodes 124 in response to the plurality of input voltages. The memory cell arrangement 300 further includes: one or more first control lines WL connected to the one or more output nodes 124 of each memory cell driver 100 of the first set of memory cell drivers 300w; one or more second control lines SL, BL connected to the one or more output nodes 124 of each memory cell driver 100 of the second set of memory cell drivers 300sb; and a plurality of memory cells, wherein each memory cell 220 of the plurality of memory cells includes one or more first control nodes 222w and one or more second control nodes 222s, 222b, wherein the one or more first control nodes 222w and the one or more second control nodes 222s, 222b of each memory cell 220 of the plurality of memory cells are connected to the one or more first control lines WL and the one or more second control lines SL, BL respectively.

In example 18, the memory cell arrangement of example 17 may optionally include that each memory cell of the plurality of memory cells is unambiguously assigned to one memory cell driver 100 of the first set of memory cell drivers 300w and one memory cell driver 100 of the second set of memory cell drivers 300sb. Illustratively, each memory cell of the plurality of memory cells may be unambiguously addressable within the memory cell arrangement 300 via two corresponding memory cell drivers 100.

In example 19, the memory cell arrangement of example 17 or 18 may optionally include a voltage supply circuit (e.g. a voltage generator and/or voltage converter, etc.) configured to provide the first supply voltage 102v and the second supply voltage 112v to each memory cell driver 100 of the first set of memory cell drivers 300w, and configured to provide the first supply and the second supply voltage 112v to each memory cell driver 100 of the second set of memory cell drivers 300sb. The voltage supply circuit may be configured to provide the first supply voltage 102v and the second supply voltage 112v for each memory cell driver 100 of the first set of memory cell drivers 300w with an offset relative to the first supply voltage 102v and the second supply voltage 112v for each memory cell driver 100 of the second set of memory cell drivers 300sb.

In example 20, the memory cell arrangement of example 19 may optionally include that the plurality of memory cells define a programming voltage for writing (e.g., programming and/or erasing) one or more of the plurality of memory cells. Further, a voltage difference between the first supply voltage 102v and the second supply voltage 112v provided to each memory cell driver 100 of the first set of memory cell drivers 300w may be in the range from about 60% to about 72% of the programming voltage, in particular about ⅔ of the programming voltage. Further, a voltage difference between the first supply voltage 102v and the second supply voltage 112v provided to each memory cell driver 100 of the second set of memory cell drivers 300sb may be in the range from about 60% to about 72% of the programming voltage, in particular about ⅔ of the programming voltage.

In example 21, the memory cell arrangement of example 20 may optionally include that the offset is in the range from about 28% to about 40% of the programming voltage, in particular about ⅓ of the programming voltage.

In example 22, the memory cell arrangement of example 20 or 21 may optionally include an addressing circuit 340 configured to provide the plurality of input voltages 114v for each memory cell driver 100 of the first set of memory cell drivers 300w and each memory cell driver 100 of the second set of memory cell drivers 300sb.

In example 23, the memory cell arrangement of example 22 may optionally include that the addressing circuit 340 is configured to provide the plurality of input voltages 114v for each memory cell driver 100 of the first set of memory cell drivers 300w and each memory cell driver 100 of the second set of memory cell drivers 300sb to perform one or more write operations for one or more memory cells of the plurality of memory cells.

In example 24, the memory cell arrangement of example 22 or 23 may optionally include that the addressing circuit 340 and the voltage supply circuit are configured to provide a programming voltage to the one or more memory cells with a first polarity during a first write operation (e.g. a programming operation for an n-type FeFET, wherein the n-type FeFET is set to the LVT state, e.g. an erase operation for a p-type FeFET, wherein the p-type FeFET is set to the HVT state) and/or with a second polarity during a second write operation (e.g. an erase operation for an n-type FeFET, wherein the n-type FeFET is set to the HVT state, e.g. a programming operation for a p-type FeFET, wherein the p-type FeFET is set to the LVT state), wherein the first polarity is opposite the second polarity.

In example 25, the memory cell arrangement of any one of examples 22 to 24 may optionally include that the addressing circuit 340 and the voltage supply circuit are configured to provide, for each write operation, the plurality of input voltages 114v to the memory cell drivers 100 before the first and second supply voltages 102v, 112v are provided to the memory cell drivers 100.

Example 26 is a method for operating a memory cell arrangement, the memory cell arrangement including a plurality of memory cells. The method including: providing a first supply voltage to a first supply node of one or more memory cell drivers of a first set of memory cell drivers; providing a second supply voltage to a second supply node of the one or more memory cell drivers of the first set of memory cell drivers; providing a third supply voltage to a first supply node of one or more memory cell drivers of a second set of memory cell drivers; providing a fourth supply voltage to a second supply node of the one or more memory cell drivers of the second set of memory cell drivers; and operating one or more memory cells of the plurality of memory cells via one or more memory cell drivers of the first set of memory cell drivers and one or more memory cell drivers of the second set of memory cell drivers. Each memory cell driver of the first and second set of memory cell drivers may be configured as described in examples 1 to 13. In some aspects, one of the supply voltages may be zero volt. In some aspects, one of the supply voltages may be any suitable reference voltage (e.g. the ground voltage).

In example 27, the method of example 26 may optionally include that the plurality of memory cells define a programming voltage for writing (e.g., programming and/or erasing) the plurality of memory cells. Further, a voltage difference between the first supply voltage and the second supply voltage may be in the range from about 60% to about 72% of the programming voltage, in particular about ⅔ of the programming voltage. Further, a voltage difference between the third supply voltage and the fourth supply voltage may be in the range from about 60% to about 72% of the programming voltage, in particular about ⅔ of the programming voltage.

In example 28, the method of example 27 may optionally include that the first supply voltage and the second supply voltage are provided with an offset relative to the third supply voltage and the fourth supply voltage.

In example 29, the method of example 28 may optionally include that the offset is in the range from about 28% to about 40% of the programming voltage. In particular, the offset may be about ⅓ of the programming voltage.

In example 30, the method of any one of examples 26 to 29 may optionally include that operating the one or more memory cells includes applying a first voltage ramping scheme and a second voltage ramping scheme to perform a first write operation and a second write operation respectively.

In example 31, the method of example 30 may optionally include that the first voltage ramping scheme includes ramping the first supply voltage to a first predefined voltage value, the second supply voltage to a third predefined voltage value, the third supply voltage to a second predefined voltage value, and the fourth supply voltage to a fourth predefined voltage value. Further, the second voltage ramping scheme may include ramping the first supply voltage to the second predefined voltage value, the second supply voltage to the fourth predefined voltage value, the third supply voltage to the first predefined voltage value, and the fourth supply voltage to the third predefined voltage value.

In example 32, the method of example 31 may optionally include that the first predefined voltage value is greater than the second predefined voltage value, the second predefined voltage value is greater than the third predefined voltage value, and the third predefined voltage value is greater than the fourth predefined voltage value.

In example 33, the method of example 31 or 32 may optionally include that a difference between the first predefined voltage value and the fourth predefined voltage value is substantially equal to the programming voltage.

In example 34, the method of example 30 may optionally include that, in the case that the first voltage ramping scheme is applied, the first supply voltage is greater than the third supply voltage, the third supply voltage is greater than the second supply voltage, and the second supply voltage is greater than the fourth supply voltage. Further, in the case that the second voltage ramping scheme is applied, the third supply voltage may be greater than the first supply voltage, the first supply voltage may be greater than the fourth supply voltage, and the fourth supply voltage may be greater than the second supply voltage.

In example 35, the method of example 34 may optionally include that, in the case that the first voltage ramping scheme is applied, a voltage difference between the first supply voltage and the fourth supply voltage is substantially equal to the programming voltage. Further, in the case that the second voltage ramping scheme is applied, a voltage difference between the third supply voltage and the second supply voltage may be substantially equal to the programming voltage.

In example 36, the method of example 34 or 35 may optionally include that, in the case that the first voltage ramping scheme is applied, a voltage difference between the first supply voltage and the third supply voltage is substantially equal to one-third of a programming voltage, a voltage difference between the third supply voltage and the second supply voltage is substantially equal to one-third of the programming voltage, and a voltage difference between the second supply voltage and the fourth supply voltage is substantially equal to one-third of the programming voltage. Further, in the case that the second voltage ramping scheme is applied, a voltage difference between the third supply voltage and the first supply voltage may be substantially equal to one-third of the programming voltage, a voltage difference between the first supply voltage and the fourth supply voltage may be substantially equal to one-third of the programming voltage, and a voltage difference between the fourth supply voltage and the second supply voltage may be substantially equal to one-third of the programming voltage.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell arrangement, comprising:
a first set of memory cell drivers and a second set of memory cell drivers, each memory driver of the first and second sets of memory cell drivers comprising:
a first supply node and a second supply node,
a plurality of input nodes to receive a plurality of input voltages,
one or more output nodes, and
a logic circuit connected to the first supply node, the second supply node, the plurality of input nodes, and the one or more output nodes, wherein the logic circuit comprises one or more logic gates and is configured to connect via the one or more logic gates either the first supply node or the second supply node to the one or more output nodes in response to the plurality of input voltages, wherein the first supply node of the first set of memory cell drivers is configured to receive a first supply voltage, the second supply node of the first set of memory cell drivers is configured to receive a second supply voltage, the first supply node of the second set of memory cell drivers is configured to receive a third supply voltage, and the second supply node of the second set of memory cell drivers is configured to receive a fourth supply voltage;
one or more first control lines connected to the one or more output nodes of each memory cell driver of the first set of memory cell drivers;
one or more second control lines connected to the one or more output nodes of each memory cell driver of the second set of memory cell drivers; and
a plurality of memory cells, wherein each memory cell of the plurality of memory cells comprises one or more first control nodes and one or more second control nodes, wherein the one or more first control nodes and the one or more second control nodes of each memory cell of the plurality of memory cells are connected to the one or more first control lines and the one or more second control lines respectively, wherein the plurality of memory cells define a write voltage for writing respective memory cells of the plurality of memory cells, wherein each logic circuit is configured to receive no greater than a maximum voltage level at the first and second supply nodes, wherein the maximum voltage level is below the write voltage.

2. The memory cell arrangement of claim 1, wherein each memory cell of the plurality of memory cells is unambiguously assigned to one memory cell driver of the first set of memory cell drivers and one memory cell driver of the second set of memory cell drivers.

3. The memory cell arrangement of claim 1, further comprising:
a voltage supply circuit configured to
provide the first supply voltage and the second supply voltage to each memory cell driver of the first set of memory cell drivers, and
provide the third supply and the fourth supply voltage to each memory cell driver of the second set of memory cell drivers, wherein the first supply voltage and the second supply voltage of the first set of memory cell drivers are generated with an offset relative to the third supply voltage and the fourth supply voltage of the second set of memory cell drivers.

4. The memory cell arrangement of claim 3,
wherein a voltage difference between the first supply voltage and the second supply voltage is substantially equal to about two thirds of the write voltage, and
wherein a voltage difference between the third supply voltage and the fourth supply voltage is substantially equal to about two thirds of the write voltage.

5. The memory cell arrangement of claim 4,
wherein the offset is substantially equal to about one third of the write voltage.

6. The memory cell arrangement of claim 4, further comprising:
an addressing circuit configured to provide the plurality of input voltages of the first set of memory cell drivers to each memory cell driver of the first set of memory cell drivers and to provide the plurality of input voltages of the second set of memory cell drivers to each memory cell driver of the second set of memory cell drivers.

7. The memory cell arrangement of claim 6,
wherein the addressing circuit is configured to provide the plurality of input voltages of the first set of memory cell drivers to each memory cell driver of the first set of memory cell drivers and to provide the plurality of input voltages of the second set of memory cell drivers to each memory cell driver of the second set of memory cell drivers in order to perform one or more write operations for one or more memory cells of the plurality of memory cells.

8. The memory cell arrangement of claim 7,
wherein the addressing circuit and the voltage supply circuit are configured to provide a write voltage to the one or more memory cells with a first polarity during a first write operation and/or with a second polarity during a second write operation, wherein the first polarity is opposite the second polarity.

9. The memory cell arrangement of claim 7,
wherein the addressing circuit and the voltage supply circuit are configured to provide, for each write operation, the plurality of input voltages of the first and second sets of memory cell drivers to the memory cell drivers of the first and second set of memory cell drivers before the first and second supply voltages of the first and second set of memory cell drivers are provided to the memory cell drivers of the first and second set of memory cell drivers.

10. The memory cell arrangement of claim 1,
wherein each memory cell of the plurality of memory cells comprises a ferroelectric field-effect transistor.

11. A method for operating a memory cell arrangement of claim 1, the method comprising:
providing the first supply voltage to the first supply node of each memory cell driver of the first set of memory cell drivers;
providing the second supply voltage to the second supply node of each memory cell driver of the first set of memory cell drivers;
providing the third supply voltage to the first supply node of each memory cell driver of the second set of memory cell drivers; and
providing the fourth supply voltage to the second supply node of each memory cell driver of the second set of memory cell drivers.

12. The method of claim 11, further comprising:
providing, for each memory driver of the first set of memory cell drivers, a first plurality of input voltages of the plurality of input voltages to the plurality of input nodes of the first set of memory cell drivers in order to control the memory driver of the first set of memory cell drivers to output either the first supply voltage or the second supply voltage to a respective one or more of the first control lines; and
providing, for each memory driver of the second set of memory cell drivers, a second plurality of input voltages of the plurality of input voltages to the plurality of input nodes of the second set of memory cell drivers in order to control the memory driver of the second set of memory cell drivers to output either the third supply voltage or the fourth supply voltage to the respective one or more second control lines.

13. The method of claim 12,
wherein the plurality of memory cells define a write voltage for writing the plurality of memory cells; and
wherein a voltage difference between the first supply voltage and the second supply voltage is substantially equal to about two thirds of the write voltage, and
wherein a voltage difference between the third supply voltage and the fourth supply voltage is substantially equal to about two thirds of the write voltage.

14. The method of claim 13,
wherein the first supply voltage and the second supply voltage are provided with an offset relative to the third supply voltage and the fourth supply voltage.

15. The method of claim 14,
wherein the offset is substantially equal to about one third of the write voltage.

16. The method of claim 11,
wherein, during a first write operation, the first supply voltage is greater than the third supply voltage, the third supply voltage is greater than the second supply voltage, and the second supply voltage is greater than the fourth supply voltage, and
wherein, during a second write operation, the third supply voltage is greater than the first supply voltage, the first supply voltage is greater than the fourth supply voltage, and the fourth supply voltage is greater than the second supply voltage.

17. The method of claim 16,
wherein, during the first write operation, a voltage difference between the first supply voltage and the fourth supply voltage is substantially equal to a write voltage, and
wherein, during the second write operation, a voltage difference between the third supply voltage and the second supply voltage is substantially equal to the write voltage.

18. The method of claim 16,
wherein, during the first write operation, a voltage difference between the first supply voltage and the third supply voltage is substantially equal to one-third of a write voltage, a voltage difference between the third supply voltage and the second supply voltage is substantially equal to one-third of the write voltage, and a voltage difference between the second supply voltage and the fourth supply voltage is substantially equal to one-third of the write voltage, and
wherein, during the second write operation, a voltage difference between the third supply voltage and the first supply voltage is substantially equal to one-third of the write voltage, a voltage difference between the first supply voltage and the fourth supply voltage is substantially equal to one-third of the write voltage, and a voltage difference between the fourth supply voltage and the second supply voltage is substantially equal to one-third of the write voltage.

19. The memory cell arrangement of claim 1, wherein each logic circuit configured to receive no greater than the maximum voltage level at the first and second supply nodes comprises each logic circuit configured to receive only the first, second, third, or four supply voltages, wherein each one of the first, second, third, and four supply voltages is no greater than the maximum voltage level, wherein the maximum voltage level is substantially equal to about two thirds of the write voltage.

20. A memory cell arrangement, comprising:
a first set of memory cell drivers and a second set of memory cell drivers, each memory driver of the first and second sets of memory cell drivers comprising:
a first supply node and a second supply node,
a plurality of input nodes to receive a plurality of input voltages,
one or more output nodes, and
a logic circuit connected to the first supply node, the second supply node, the plurality of input nodes, and the one or more output nodes, wherein the logic circuit comprises one or more logic gates and is configured to connect via the one or more logic gates either the first supply node or the second supply node to the one or more output nodes in response to the plurality of input voltages, wherein the first supply node of the first set of memory cell drivers is configured to receive a first supply voltage, the second supply node of the first set of memory cell drivers is configured to receive a second supply voltage, the first supply node of the second set of memory cell driver is configured to receive a third supply voltage, and the second supply node of the second set of memory cell drivers is configured to receive a fourth supply voltage;
one or more first control lines connected to the one or more output nodes of each memory cell driver of the first set of memory cell drivers;
one or more second control lines connected to the one or more output nodes of each memory cell driver of the second set of memory cell drivers
a plurality of memory cells, wherein each memory cell of the plurality of memory cells comprises one or more first control nodes and one or more second control nodes, wherein the one or more first control nodes and the one or more second control nodes of each memory cell of the plurality of memory cells are connected to the one or more first control lines and the one or more second control lines respectively; and
a voltage supply circuit configured to:
provide the first supply voltage and the second supply voltage to each memory cell driver of the first set of memory cell drivers; and
provide the third supply and the fourth supply voltage to each memory cell driver of the second set of memory cell drivers, wherein the first supply voltage and the second supply voltage of the first set of memory cell drivers are generated with an offset relative to the third supply voltage and the fourth supply voltage of the second set of memory cell drivers,
wherein the plurality of memory cells define a write voltage for writing respective memory cells of the plurality of memory cells,
wherein a first voltage difference between the first supply voltage and the second supply voltage is substantially equal to about two thirds of the write voltage, wherein a second voltage difference between the third supply voltage and the fourth supply voltage is substantially equal to about two thirds of the write voltage; and
an addressing circuit configured to provide the plurality of input voltages of the first set of memory cell drivers to each memory cell driver of the first set of memory cell drivers and to provide the plurality of input voltages of the second set of memory cell drivers to each memory cell driver of the second set of memory cell drivers in order to perform one or more write operations for one or more memory cells of the plurality of memory cells, wherein the addressing circuit and the voltage supply circuit are configured to provide, for each write operation, the plurality of input voltages of the first and second set of memory cell drivers to the memory cell drivers of the first and second set of memory cell drivers before the first and second supply voltages of the first and second set of memory cell drivers are provided to the memory cell drivers of the first and second set of memory cell drivers.

* * * * *